(12) United States Patent
Yoshida et al.

(10) Patent No.: US 10,330,994 B2
(45) Date of Patent: Jun. 25, 2019

(54) ACTIVE MATRIX SUBSTRATE, LIQUID CRYSTAL PANEL, AND METHOD FOR MANUFACTURING ACTIVE MATRIX SUBSTRATE

(71) Applicant: SHARP KABUSHIKI KAISHA, Sakai, Osaka (JP)

(72) Inventors: Masahiro Yoshida, Sakai (JP); Masakatsu Tominaga, Sakai (JP); Tomoo Furukawa, Sakai (JP); Junichi Morinaga, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/579,576

(22) PCT Filed: May 27, 2016

(86) PCT No.: PCT/JP2016/065696
§ 371 (c)(1),
(2) Date: Dec. 4, 2017

(87) PCT Pub. No.: WO2016/194804
PCT Pub. Date: Dec. 8, 2016

(65) Prior Publication Data
US 2018/0173063 A1 Jun. 21, 2018

(30) Foreign Application Priority Data
Jun. 5, 2015 (JP) .................................. 2015-114598

(51) Int. Cl.
*G02F 1/1343* (2006.01)
*G02F 1/1368* (2006.01)
(Continued)

(52) U.S. Cl.
CPC ...... *G02F 1/134363* (2013.01); *G02F 1/1368* (2013.01); *G02F 1/133512* (2013.01);
(Continued)

(58) Field of Classification Search
CPC ......... G02F 1/134363; G02F 1/133512; G02F 1/1343; G02F 1/136286; G02F 1/1368;
(Continued)

(56) References Cited

U.S. PATENT DOCUMENTS

2006/0146246 A1* 7/2006 Choo .................... G02F 1/1368
349/139
2008/0303024 A1 12/2008 Song et al.
(Continued)

FOREIGN PATENT DOCUMENTS

JP 2010-191410 A 9/2010

*Primary Examiner* — Sitaramarao S Yechuri
(74) *Attorney, Agent, or Firm* — ScienBiziP, P.C.

(57) ABSTRACT

A drain electrode 25 of a TFT 21 overlaps with a gate electrode formed integrally with a gate line 23. A pixel electrode 22 has a main body part formed on a first side of the gate line 23, and an extension part extending in an extending direction of a data line 24 and covering an overlapping portion of the gate electrode and the drain electrode 25. The drain electrode 25 is not formed on a second side of the gate line 23, whereas the extension part of the pixel electrode 22 is formed also on the second side of the gate line 23. Even when a position of the pixel electrode 22 is shifted in the extending direction of the data line 24, a parasitic capacitance between a drain and a source of the TFT 21 is kept constant, because an area of a portion where the extension part of the pixel electrode 22 overlaps with the gate line 23 does not change. With this, degradation of display quality due to a variation in the parasitic capacitance between the gate and drain of the TFT 21 can be prevented.

16 Claims, 22 Drawing Sheets

(51) Int. Cl.
*G02F 1/1335* (2006.01)
*G02F 1/1362* (2006.01)
*H01L 29/786* (2006.01)
*G02F 1/136* (2006.01)

(52) U.S. Cl.
CPC ...... *G02F 1/136286* (2013.01); *H01L 29/786* (2013.01); *G02F 2001/13606* (2013.01); *G02F 2001/134318* (2013.01); *G02F 2201/122* (2013.01); *G02F 2201/123* (2013.01)

(58) Field of Classification Search
CPC .......... G02F 2001/134318; G02F 2001/13606; G02F 2201/122; G02F 2201/123
See application file for complete search history.

(56) References Cited

U.S. PATENT DOCUMENTS

| | | | |
|---|---|---|---|
| 2010/0187532 A1 | 7/2010 | Nagano et al. | |
| 2011/0147752 A1* | 6/2011 | Yamazaki | G02F 1/133553 257/59 |
| 2014/0362320 A1* | 12/2014 | Sato | G02F 1/134363 349/43 |

* cited by examiner

ACTIVE MATRIX SUBSTRATE, LIQUID CRYSTAL PANEL, AND METHOD FOR MANUFACTURING ACTIVE MATRIX SUBSTRATE

TECHNICAL FIELD

The present invention relates to a display device, and particularly relates to an active matrix substrate, a liquid crystal panel including the active matrix substrate, and a method for manufacturing the active matrix substrate.

BACKGROUND ART

A liquid crystal display device has been widely used as a thin, light-weight, and low power consumption display device. A liquid crystal panel included in the liquid crystal display device has a structure formed by attaching an active matrix substrate and a counter substrate together, and providing a liquid crystal layer between the two substrates. A plurality of gate lines, a plurality of data lines, and a plurality of pixel circuits each including a thin film transistor (hereinafter referred to as a TFT) and a pixel electrode are formed on the active matrix substrate.

As a system for applying an electric field to the liquid crystal layer of the liquid crystal panel, a vertical electric field system and a lateral electric field system are known. In a liquid crystal panel of the vertical electric field system, an almost vertical electric field is applied to the liquid crystal layer by using the pixel electrode and a common electrode formed on the counter substrate. In a liquid crystal panel of the lateral electric field system, the common electrode is formed on the active matrix substrate together with the pixel electrode, and an almost lateral electric field is applied to the liquid crystal layer by using the pixel electrode and the common electrode. The liquid crystal panel of the lateral electric field system has an advantage of having a wider view angle than that in the liquid crystal panel of the vertical electric field system.

As the lateral electric field system, an IPS (In-Plane Switching) mode and an FFS (Fringe Field Switching) mode are known. In a liquid crystal panel of the IPS mode, the pixel electrode and the common electrode are each formed in the shape of comb teeth, and are disposed so as not to overlap each other in a plan view. In a liquid crystal panel of the FFS mode, a slit is formed either in the common electrode or the pixel electrode, and the pixel electrode and the common electrode are disposed so as to overlap each other via a protective insulating film in a plan view. The liquid crystal panel of the FFS mode has an advantage of having a higher aperture ratio than that in the liquid crystal panel of the IPS mode.

The liquid crystal panel of the lateral electric field system is described in Patent Documents 1 and 2, for example. In the liquid crystal panels described in Patent Documents 1 and 2, the common electrode is formed corresponding to almost all of a display region (except for the slit and the like). The common electrode is formed in a layer over the data line, with an insulating film interposed therebetween. The pixel electrode and a drain electrode of the TFT are directly connected to each other without interposing a contact hole formed in the insulating film. Patent Documents 1 and 2 also describe a method for manufacturing the active matrix substrate, the method including a step for forming a channel region of the TFT while forming the pixel electrode.

FIG. 20 is a layout diagram described in FIG. 8 of Patent Document 1. FIG. 21 is a layout diagram described in FIG. 2 of Patent Document 2. In FIGS. 20 and 21, a left down oblique line part represents a gate layer pattern, a right down oblique line part represents a source layer pattern, and a thick line Ex represents an edge of the pixel electrode. In order to facilitate comparison with drawings of the present application, notations in FIGS. 20 and 21 are changed from those in the original drawings.

In FIG. 20, a data line 92 has a portion functioning as a source electrode (a portion protruding rightward in the drawing). A TFT is formed by providing a drain electrode 93 opposing to the source electrode, and the like. A pixel electrode 94 has an extension part (a portion protruding downward in the drawing), and the extension part of the pixel electrode 94 overlaps with a gate line 91. In FIG. 21, a data line 96 has a portion functioning as a source electrode (a portion protruding rightward in the drawing). A TFT is formed by providing a drain electrode 97 opposing to the source electrode, and the like. A pixel electrode 98 has an extension part (a portion protruding downward in the drawing), and the extension part of the pixel electrode 98 overlaps with a gate line 95.

PRIOR ART DOCUMENTS

Patent Documents

[Patent Document 1] U.S. Laid-Open Patent Publication No. 2008/303024 Specification

[Patent Document 2] Japanese Laid-Open Patent Publication No. 2010-191410

SUMMARY OF THE INVENTION

Problems to be Solved by the Invention in the liquid crystal display device, when a voltage is written to the pixel circuit, a potential of the pixel electrode is lowered by an amount corresponding to a feed-through voltage, because a potential of a gate line (gate electrode of TFT) changes from a high level to a low level. The feed-through voltage becomes larger, as a parasitic capacitance Cgd between a gate and a drain of the TFT becomes larger. In FIG. 20, the parasitic capacitance Cgd between the gate and the drain of the TFT becomes larger, as an area of a portion where the gate line 91 and the extension part of the pixel electrode 94 overlap becomes larger. The same holds true in FIG. 21.

When manufacturing the liquid crystal panel, a phenomenon (hereinafter referred to as a pattern shift) in which a position of a pattern of a certain layer is shifted from a correct position (or a position of a pattern in another layer) may occur. The pattern shift can be divided into a pattern shift in an extending direction of the gate line (horizontal direction in the drawings) and a pattern shift in an extending direction of the data line (vertical direction in the drawings). In the following, the pattern shift in the extending direction of the data line (direction orthogonal to gate line) will be focused.

In FIG. 20, when a position of a pixel electrode layer pattern is shifted upward, an area of a portion where the gate line 91 and the extension part of the pixel electrode 94 overlap is decreased. In this case, the parasitic capacitance Cgd between the gate and the drain of the TFT is decreased and the feed-through voltage is decreased. In contrast, when the position of the pixel electrode layer pattern is shifted downward, the area of the portion where the gate line 91 and the extension part of the pixel electrode 94 overlap is increased. In this case, the parasitic capacitance Cgd between the gate and the drain of the TFT is increased and the feed-through voltage is increased. The same holds true in FIG. 21. In this manner, in the liquid crystal panels described in Patent Documents 1 and 2, when the position of the pixel electrode layer pattern is shifted in the extending direction of the data line, the feed-through voltage fluctuates.

When the feed-through voltage fluctuates, display with correct luminance may not be performed, or a flicker may occur. These display defects can be suppressed by a method of adjusting a potential of the common electrode, a method of previously correcting a potential to be written to the pixel electrode, or the like. However, it is sometimes difficult to individually perform the above-described adjustment or correction for each pixel circuit. Thus, when a fluctuation amount of the feed-through voltage differs among the pixel circuits, display quality of the liquid crystal display device is degraded. For example, when exposure is sequentially performed to a plurality of blocks using a step-and-repeat method in a process of forming the pixel electrode, shifts in an exposed portion may occur among a plurality of exposures, and different pattern shifts may occur for each block. In this case, block-shaped display unevenness occurs in a display screen of the liquid crystal display device. Furthermore, when a scanning exposure method is used in the process of forming the pixel electrode, minute shifts may occur in the exposed portion due to a stage movement in an exposure apparatus, and different pattern shifts may occur for each line. In this case, band-like display unevenness and a flicker occur in the display screen of the liquid crystal display device. In this manner, a conventional liquid crystal display device has a problem that display quality is degraded due to a variation in the parasitic capacitance between the gate and the drain of the TFT in the pixel circuit.

Accordingly, an object of the present invention is to provide an active matrix substrate, a liquid crystal panel, and a method for manufacturing the active matrix substrate, which prevent degradation of display quality due to the variation in the parasitic capacitance between the gate and the drain of the ITT in the pixel circuit.

Means for Solving the Problems

According to a first aspect of the present invention, there is provided an active matrix substrate including: a plurality of gate lines extending in a first direction; a plurality of data lines extending in a second direction; a plurality of pixel circuits arranged corresponding to intersections of the gate lines and the data lines and each including a thin film transistor and a pixel electrode; a protective insulating film formed in a layer over the gate line, the data line, the thin film transistor, and the pixel electrode; and a common electrode formed in a layer over the protective insulating film, wherein the thin film transistor has a gate electrode formed integrally with the gate line, a source electrode formed integrally with the data line, and a drain electrode directly connected to the pixel electrode and having an overlapping portion with the gate electrode, the pixel electrode has a main body part formed on a first side of the gate line, and an extension part extending in the second direction and covering the overlapping portion of the gate electrode and the drain electrode, the drain electrode is not formed on a second side of the gate line, and the extension part of the pixel electrode is formed also on the second side of the gate line.

According to a second aspect of the present invention, in the first aspect of the present invention, the drain electrode is formed in a region where the gate line and the gate electrode are formed.

According to a third aspect of the present invention, in the first aspect of the present invention, a semiconductor layer of the thin film transistor is formed in a region where the gate line and the gate electrode are formed.

According to a fourth aspect of the present invention, in the first aspect of the present invention, the gate line is configured to pass through the pixel circuit, the pixel electrode further has a second main body part formed on the second side of the gate line, and the extension part of the pixel electrode is configured to connect the main body part and the second main body part of the pixel electrode.

According to a fifth aspect of the present invention, in the fourth aspect of the present invention, the common electrode has one or more slits in a region corresponding to the main body part and the second main body part, and at least one slit is not formed above the gate line.

According to a sixth aspect of the present invention, in the first aspect of the present invention, the thin film transistors are formed on both sides of the data line alternately.

According to a seventh aspect of the present invention, in the first aspect of the present invention, the common electrode has one or more slits corresponding to the pixel circuit.

According to an eighth aspect of the present invention, in the first aspect of the present invention, a semiconductor layer is formed in a layer under the data line, the source electrode, and the drain electrode.

According to a ninth aspect of the present invention, there is provided a liquid crystal panel including: the active matrix substrate according to one of the first to eighth aspects; and a counter substrate facing the active matrix substrate.

According to a tenth aspect of the present invention, there is provided a method for manufacturing an active matrix substrate including a plurality of pixel circuits each having a thin film transistor and a pixel electrode, the method including the steps of: forming a plurality of gate lines extending in a first direction, and concurrently forming a gate electrode of the thin film transistor integrally with the gate line; forming a semiconductor layer of the thin film transistor; forming a source layer by forming a main conductor part of a plurality of data lines extending in a second direction, and concurrently forming a conductor part to be a base of a drain electrode and a source electrode of the thin film transistor, integrally with the main conductor part; forming a pixel electrode layer by forming the pixel electrode and an accessory conductor part of the data line, and concurrently patterning the conductor part to form the drain electrode and the source electrode of the thin film transistor; forming a protective insulating film in a layer over the pixel electrode; and forming a common electrode in a layer over the protective insulating film, wherein in forming the source layer and in forming the pixel electrode layer, the drain electrode is formed so as to have an overlapping portion with the gate electrode, in forming the pixel electrode layer, an electrode having a main body part formed on a first side of the gate line and an extension part extending in the second direction and covering the overlapping portion of the gate electrode and the drain electrode is formed directly connected to the drain electrode as the pixel electrode, in forming the source layer and in forming the pixel electrode layer, the drain electrode is not formed on a second side of the gate line, and in forming the pixel electrode layer, the extension part of the pixel electrode is formed also on the second side of the gate line.

According to an eleventh aspect of the present invention, in the tenth aspect of the present invention, in forming the semiconductor layer, a semiconductor film is formed and the semiconductor film is patterned.

According to a twelfth aspect of the present invention, in the tenth aspect of the present invention, in forming the semiconductor layer, a semiconductor film is formed, and in forming the source layer, the main conductor part and the conductor part are formed and concurrently the semiconductor film is patterned.

Effects of the Invention

According to the first aspect of the present invention, by forming the extension part of the pixel electrode also on the second side of the gate line (a side opposite to a side where the main body part of the pixel electrode is disposed), even when positions of the pixel electrode and the drain electrode are shifted in the second direction to some extent, an area of a portion where the gate line and the extension part of the pixel electrode overlap does not change. Thus, among the pixel circuits, a parasitic capacitance between a gate and a drain of the thin film transistor is approximately equal, and a feed-through voltage is also approximately equal. Therefore, degradation of display quality due to a variation in the parasitic capacitance between the gate and the drain of the thin film transistor can be prevented. Furthermore, since the drain electrode is not formed on the second side of the gate line, display defects due to a defect in a rubbing process, a fluctuation in an aperture ratio, and an influence of light from a backlight can be prevented.

According to the second aspect of the present invention, even when an attachment shift occurs between the active matrix substrate and a counter substrate, it is possible to prevent the drain electrode and an opening of a black matrix formed on the counter substrate from overlapping, and prevent a decrease in the aperture ratio. Furthermore, the display defect due to the influence of the light from the backlight can be prevented more effectively.

According to the third aspect of the present invention, by forming the semiconductor layer in the region where the gate line and the gate electrode are formed, the display defect due to the influence of the light from the backlight can be prevented.

According to the fourth aspect of the present invention, even when a position of the pixel electrode is shifted in the second direction to some extent, an amount of the parasitic capacitance generated between the gate line and the pixel electrode can be kept approximately constant.

According to the fifth aspect of the present invention, by providing the slit to the common electrode in the region corresponding to the main body part and the second main body part of the pixel electrode, it is possible to generate a lateral electric field for widening a view angle of a liquid crystal panel including the active matrix substrate. Furthermore, by not providing the slit over the gate line, it is possible to generate the lateral electric field while preventing an electric field generated by a voltage applied to the gate line from affecting an alignment of liquid crystal.

According to the sixth aspect of the present invention, the active matrix substrate can be used suitably for a display device performing a dot inversion drive, without increasing a load of the data line.

According to the seventh aspect of the present invention, by providing the slit to the common electrode, it is possible to generate the lateral electric field for widening the view angle of the liquid crystal panel including the active matrix substrate.

According to the eighth aspect of the present invention, it is possible to easily manufacture the active matrix substrate having the semiconductor layer in a layer under a source layer pattern.

According to the ninth aspect of the present invention, it is possible to configure a liquid crystal panel which prevents degradation of display quality due to the variation in the parasitic capacitance between the gate and the drain of the thin film transistor.

According to the tenth or eleventh aspect of the present invention, it is possible to manufacture an active matrix substrate which prevents degradation of display quality due to the variation in the parasitic capacitance between the gate and the drain of the thin film transistor. Furthermore, by forming the drain electrode of the thin film transistor in forming the pixel electrode layer, it is possible to suppress an increase in the parasitic capacitance between the gate and the drain of the thin film transistor without enlarging the drain electrode more than necessary.

According to the twelfth aspect of the present invention, by patterning the semiconductor layer in forming the source layer, the active matrix substrate can be manufactured using a small number of photomasks.

MODES FOR CARRYING OUT THE INVENTION

First Embodiment

Figure 1:
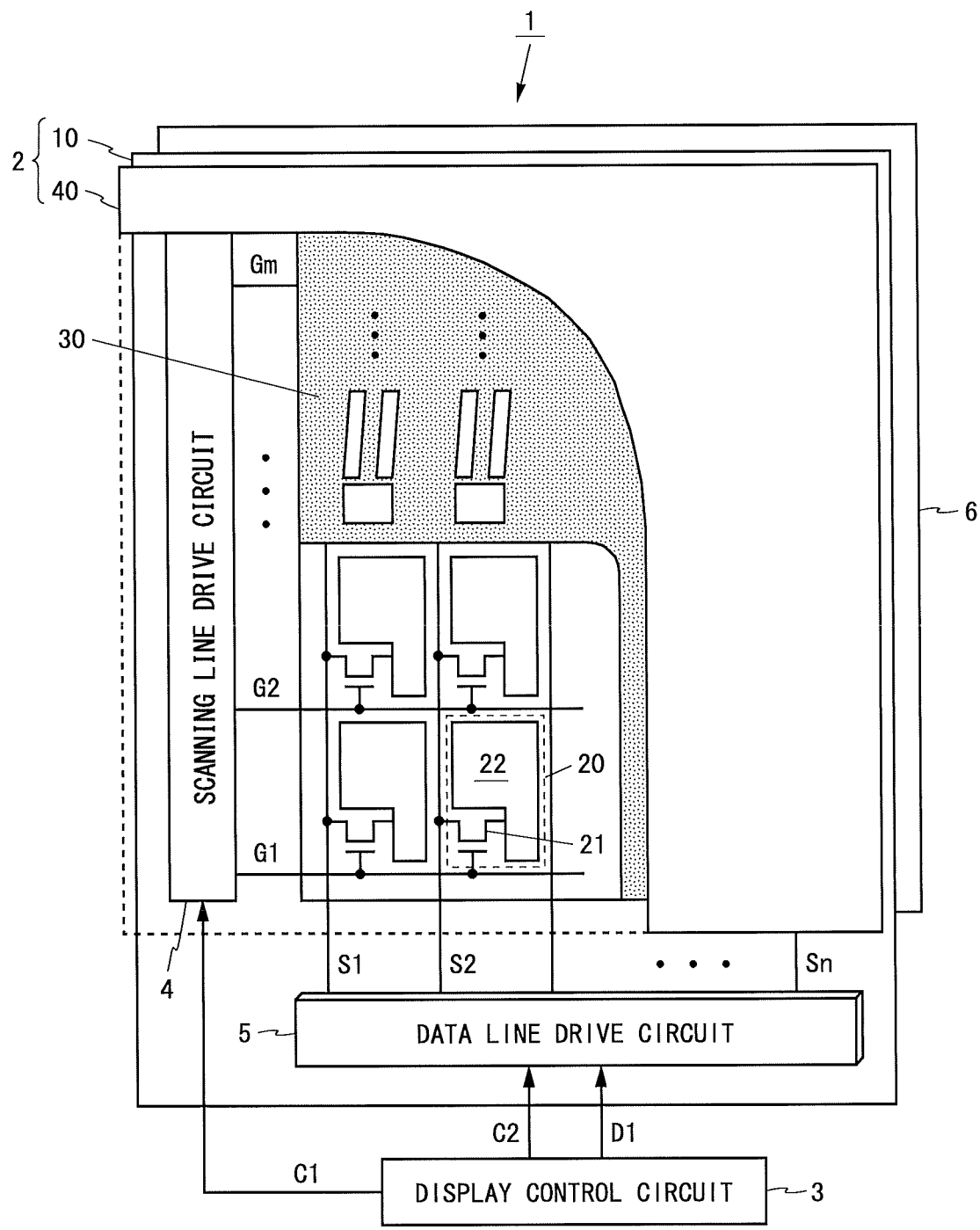
FIG. 1 is a block diagram showing a configuration of a liquid crystal display device provided with an active matrix substrate according to a first embodiment of the present invention.

FIG. 1 is a block diagram showing a configuration of a liquid crystal display device provided with an active matrix substrate according to a first embodiment of the present invention. A liquid crystal display device 1 shown in FIG. 1 includes a liquid crystal panel 2, a display control circuit 3, a gate line drive circuit 4, a data line drive circuit 5, and a backlight 6. Hereinafter, it is assumed that m and n are integers not smaller than 2, i is an integer not smaller than 1 and not larger than m, and j is an integer not smaller than 1 and not larger than n.

The liquid crystal panel 2 has a structure formed by attaching an active matrix substrate 10 and a counter substrate 40 together, and providing a liquid crystal layer between the two substrates. A black matrix (not shown) and the like are formed on the counter substrate 40. m gate lines G1 to Gm, n data lines S1 to Sn, (m×n) pixel circuits 20, a common electrode 30 (dot pattern part), and the like are formed on the active matrix substrate 10. The gate line drive circuit 4 is integrally formed together with the pixel circuit 20 and the like on the active matrix substrate 10, and a semiconductor chip functioning as the data line drive circuit 5 is mounted on the active matrix substrate 10. Note that FIG. 1 schematically shows the configuration of the liquid crystal display device 1, and shapes of the elements shown in FIG. 1 are not accurate.

Hereinafter, a direction in which the gate line extends (a horizontal direction in the drawings) is referred to as a row direction, and a direction in which the data line extends (a vertical direction in the drawings) is referred to as a column direction. The gate lines G1 to Gm extend in the row direction and are arranged in parallel with each other. The data lines S1 to Sn extend in the column direction and are arranged in parallel with each other. The gate lines G1 to Gm and the data lines S1 to Sn intersect at (m×n) points. The (m×n) pixel circuits 20 are arranged two-dimensionally corresponding to intersections of the gate lines G1 to Gm and the data lines S1 to Sn.

The pixel circuit 20 includes an N-channel TFT 21 and a pixel electrode 22. The TFT 21 included in the pixel circuit 20 in an i-th row and a j-th column has a gate electrode connected to a gate line Gi, a source electrode connected to a data line Sj, and a drain electrode connected to the pixel electrode 22. A protective insulating film (not shown) is formed in a layer over the gate lines G1 to Gm, the data lines S1 to Sn, the TFT 21, and the pixel electrode 22. The common electrode 30 is formed in a layer over the protective insulating film. The pixel electrode 22 and the common electrode 30 face each other, with the protective insulating film interposed therebetween. The backlight 6 is disposed on a back surface side of the liquid crystal panel 2 and irradiates a back surface of the liquid crystal panel 2 with light. Polarizing plates (not shown) are disposed on a surface of the active matrix substrate 10 opposite to the liquid crystal layer and on a surface of the counter substrate 40 opposite to the liquid crystal layer.

The display control circuit 3 outputs a control signal C1 to the gate line drive circuit 4, and outputs a control signal C2 and a data signal D1 to the data line drive circuit 5. The gate line drive circuit 4 drives the gate lines G1 to Gm based on the control signal C1. The data line drive circuit 5 drives the data lines S1 to Sn based on the control signal C2 and the data signal D1. More specifically, the gate line drive circuit 4 selects one gate line from among the gate lines G1 to Gm in each horizontal period (line period), and applies a high-level voltage to the selected gate line. The data line drive circuit 5 respectively applies n data voltages in accordance with the data signal D1 to the data lines S1 to Sn in each horizontal period. With this, n pixel circuits 20 are selected in one horizontal period, and the n data voltages are respectively written to the selected n pixel circuits 20.

Figure 2:
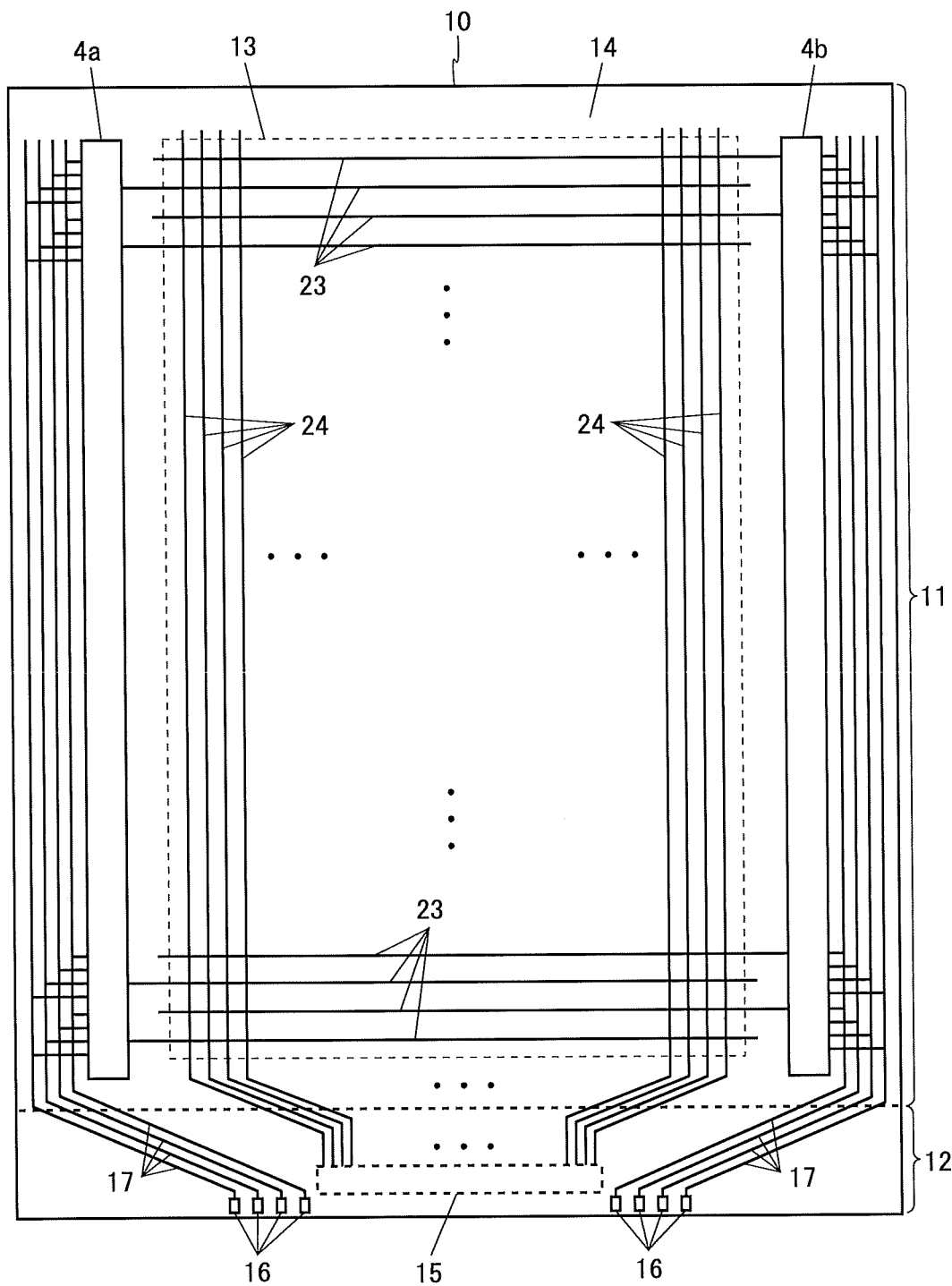
FIG. 2 is a plan view of the active matrix substrate shown in FIG. 1.

FIG. 2 is a plan view of the active matrix substrate 10. As shown in FIG. 2, the active matrix substrate 10 is divided into a counter region 11 facing the counter substrate 40, and a non-counter region 12 not facing the counter substrate 40. A display region 13 for arranging the pixel circuits 20 is set in the counter region 11. A remaining portion after removing the display region 13 from the counter region 11 is referred to as a frame region 14. The frame region 14 is shielded by a black matrix (not shown) formed on the counter substrate 40.

In the display region 13, m gate lines 23, n data lines 24, and (m×n) pixel circuits (not shown) are formed. The m gate lines 23 extend in the row direction in the display region 13. The n data lines 24 extend in the column direction in the display region 13. The gate lines 23 and the data lines 24 are formed in different wiring layers. The (m×n) pixel circuits are arranged two-dimensionally in the display region 13.

The gate line drive circuit 4 is formed in the frame region 14, being divided into two portions. More specifically, apart of the gate line drive circuit 4 (hereinafter referred to as a first gate line drive unit 4a) is disposed along one side in the column direction (left side in FIG. 2) of the display region 13, and a remaining part of the gate line drive circuit 4 (hereinafter referred to as a second gate line drive unit 4b) is disposed along the other side in the column direction (right side in FIG. 2) of the display region 13. One end (left end in FIG. 2) of an odd-numbered gate line 23 is connected to the first gate line drive unit 4a, and one end (right end in FIG. 2) of an even-numbered gate line 23 is connected to the second gate line drive unit 4b. Based on the control signal C1 output from the display control circuit 3, the first gate line drive unit 4a drives the odd-numbered gate lines 23 and the second gate line drive unit 4b drives the even-numbered gate lines 23.

In the non-counter region 12, a mounting region 15 for mounting the data line drive circuit 5 is set. A plurality of external terminals 16 for connecting to an external circuit (for example, a flexible printed circuit board) are formed in a portion of the non-counter region 12 other than the mounting region 15. The external terminal 16 is connected to the gate line drive circuit 4 via a wiring 17.

Figure 3:
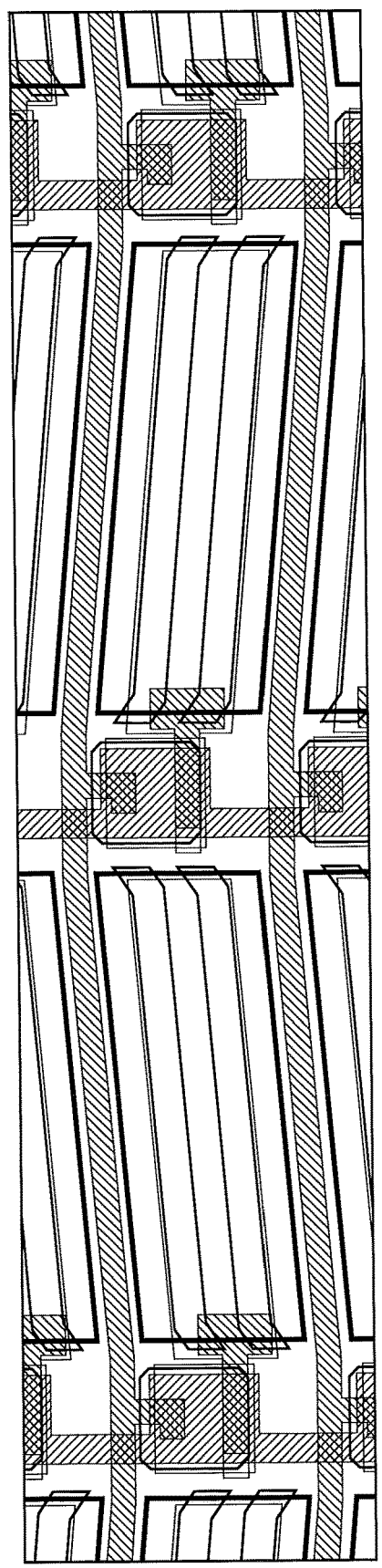
FIG. 3 is a layout diagram of a liquid crystal panel shown in FIG. 1.
Figure 4:
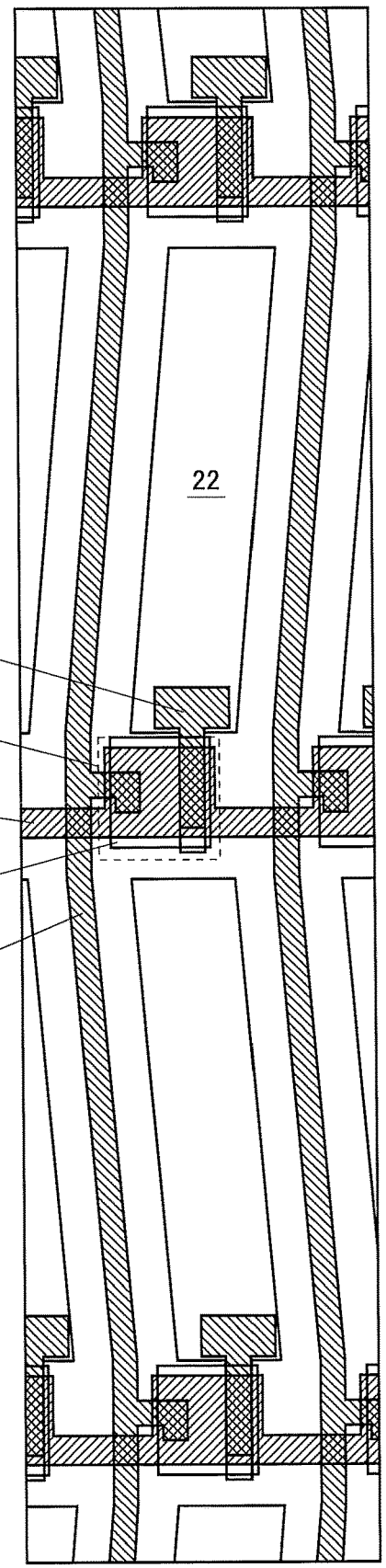
FIG. 4 is a diagram showing patterns other than a pattern of a common electrode of the active matrix substrate shown in FIG. 1.
Figure 5:
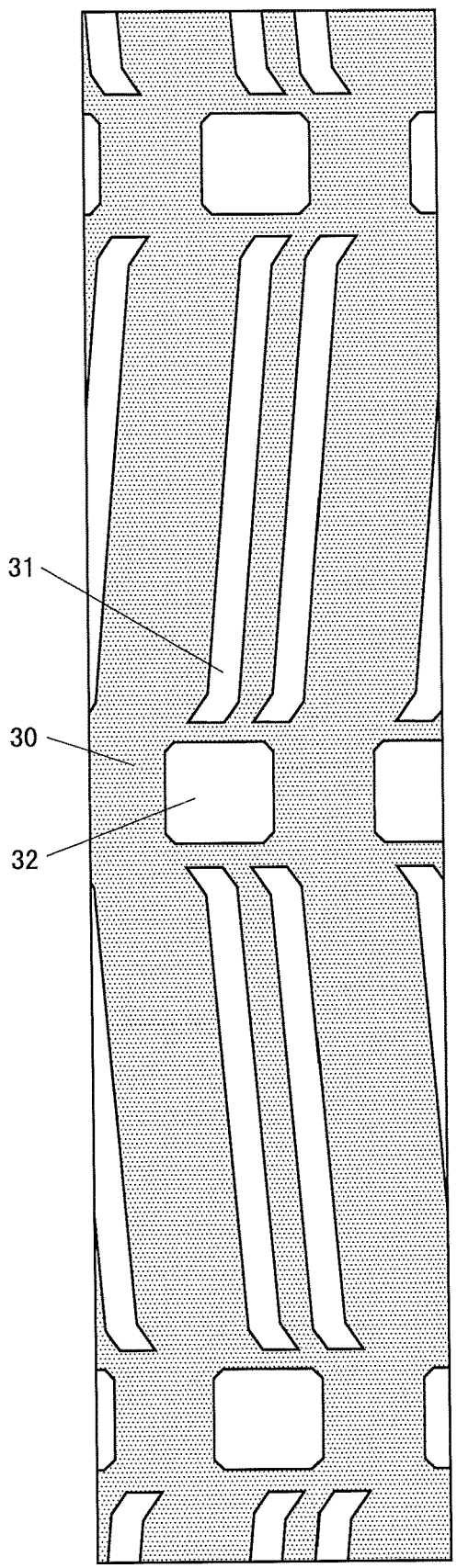
FIG. 5 is a diagram showing the pattern of the common electrode of the active matrix substrate shown in FIG. 1.
Figure 6:
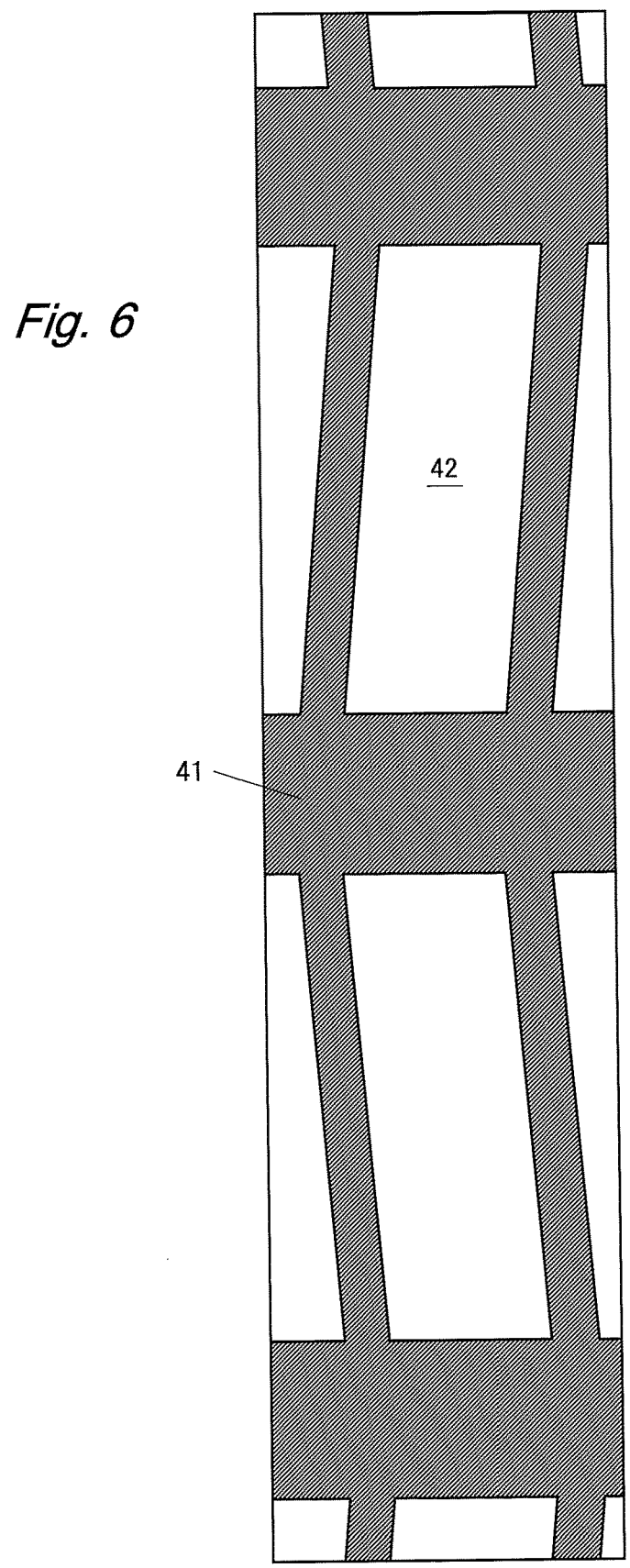
FIG. 6 is a diagram showing a pattern of a counter substrate shown in FIG. 1.

FIG. 3 is a layout diagram of the liquid crystal panel 2. FIG. 3 shows a pattern of the active matrix substrate 10 and a pattern of the counter substrate 40 in an overlapping manner. FIG. 3 is described by dividing the figure into three figures. FIG. 4 is a diagram showing patterns other than a pattern of the common electrode 30 of the active matrix substrate 10. FIG. 5 is a diagram showing the pattern of the common electrode 30 of the active matrix substrate 10. FIG. 6 is a diagram showing the pattern of the counter substrate 40. In order to facilitate understanding of the drawings, in FIG. 3, the patterns shown in FIG. 4 are indicated by thin lines, the pattern shown in FIG. 5 is indicated by thick lines, and the pattern shown in FIG. 6 is indicated by medium thick lines.

As shown in FIG. 4, the gate line 23 (left down oblique line part) extends in the row direction. The data line 24 (right down oblique line part) extends in the column direction while bending in a vicinity of an intersection with the gate line 23. In the vicinity of the intersection of the gate line 23 and the data line 24, the gate line 23 has a portion (portion protruding upward in the drawings) functioning as a gate electrode of the TFT 21. In the vicinity of the intersection of the gate line 23 and the data line 24, the data line 24 has a portion (a portion protruding rightward in the drawings) functioning as a source electrode of the TFT 21. Furthermore, a drain electrode 25 and a semiconductor layer 26 are formed in the vicinity of the intersection of the gate line 23 and the data line 24. With this, the TFT 21 is formed corresponding to the intersection of the gate line 23 and the data line 24. The pixel electrode 22 is formed in a region partitioned by the gate lines 23 and the data lines 24. The drain electrode 25 is directly connected to the pixel electrode 22 without interposing a contact hole formed in the insulating film. In this manner, the active matrix substrate 10 includes a plurality of the pixel circuits 20 arranged corresponding to the intersections of the gate lines 23 and the data lines 24.

A protective insulating film is formed in a layer over the TFT 21, the pixel electrode 22, the gate line 23, the data line 24, the drain electrode 25, and the semiconductor layer 26 (that is, on a side closer to liquid crystal layer), and the common electrode 30 is formed in a layer over the protective insulating film. As shown in FIG. 5, the common electrode 30 is formed so as to cover an entire surface of the display region 13 except for arrangement positions of slits 31 and notches 32. The common electrode 30 has a plurality of the slits 31 corresponding to the pixel electrodes 22, in order to generate a lateral electric field applied to the liquid crystal layer with the pixel electrodes 22. In FIG. 5, the common electrode 30 has two slits 31 corresponding to one pixel electrode 22. A width of the slit 31 is 2 to 4 μm, for example, and an interval between the two slits 31 is 2 to 4 μm, for example. By forming the slits 31 in the common electrode 30, the lateral electric field for widening a view angle of the liquid crystal panel 2 can be generated. The common electrode 30 has the notch 32 corresponding to the TFT 21. By forming the notch 32 in the common electrode 30, it is possible to prevent the common electrode 30 from affecting an operation of the TFT 21.

The counter substrate 40 is disposed facing the active matrix substrate 10. As shown in FIG. 6, a black matrix 41 having an opening 42 in a position facing the pixel electrode 22 is formed on the counter substrate 40. The black matrix 41 is formed in a position that faces regions including the TFT 21, the gate line 23, and the data line 24.

Figure 7:
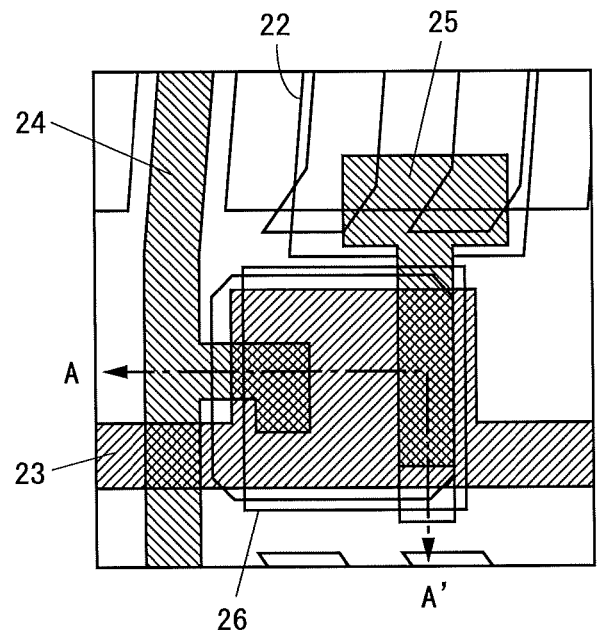
FIG. 7 is an enlarged view of FIG. 4.
Figure 8:
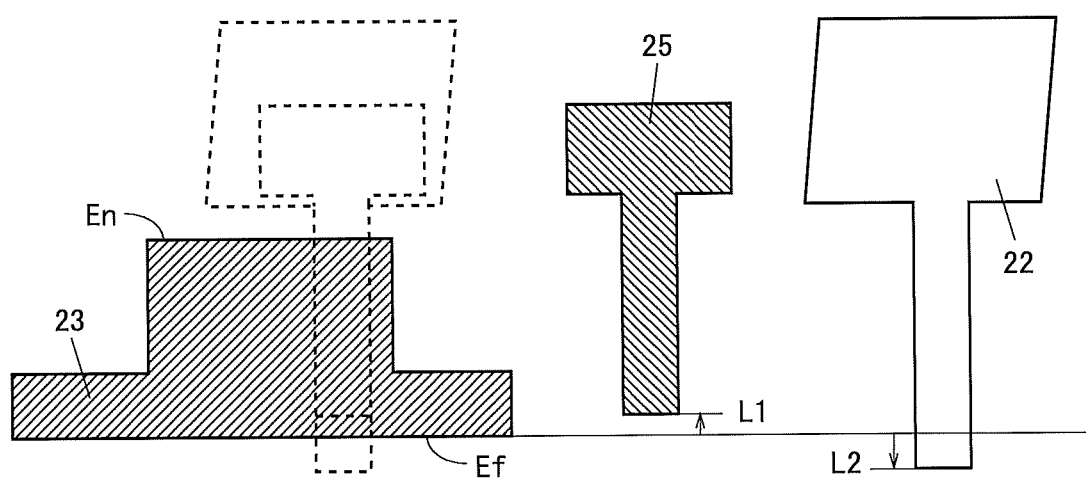
FIG. 8 is a diagram showing positions of a gate line, a drain electrode, and a pixel electrode shown in FIG. 7.

FIG. 7 is an enlarged view of FIG. 3. FIG. 7 shows a layout in a vicinity of the TFT 21. FIG. 8 is a diagram showing positions of the gate line 23, the drain electrode 25, and the pixel electrode 22 shown in FIG. 7. The three elements shown in FIG. 8 overlap in fact. The drain electrode 25 is formed in a layer over the gate line 23, and the pixel electrode 22 is formed in a layer over the drain electrode 25. In FIG. 8, the three elements are shown so as not to overlap, by moving them in the row direction.

As stated above, the gate line 23 has a portion functioning as the gate electrode of the TFT 21, and the data line 24 has a portion functioning as the source electrode of the TFT 21. In other words, the gate electrode of the TFT 21 is formed integrally with the gate line 23, and the source electrode of the TFT 21 is formed integrally with the data line 24. The drain electrode 25 has a main body part (portion extending in the column direction) opposing to the source electrode and a connection part (portion extending in the row direction) for connecting to the pixel electrode 22. The main body part of the drain electrode 25 has an overlapping portion with the gate electrode. The pixel electrode 22 has a main body part which covers the connection part of the drain electrode 25 and is opposed to the common electrode 30 and the slit 31 formed in the common electrode 30, and an extension part (portion protruding downward in the drawings) which extends in the column direction and covers the overlapping portion of the gate electrode and the drain electrode 25. In the pixel electrode 22, a portion that transmits light from the backlight and substantially contributes to display is included in the main body part. The pixel electrode 22 and the common electrode 30 are preferably formed of a transparent conductive film such as IZO (indium zinc oxide) or ITO (indium tin oxide).

As shown in FIG. 8, among edges of the gate line 23, the edges extending in the row direction, the one closest to the main body part of the pixel electrode 22 is referred to as a near end En, and the one farthest from the main body part of the pixel electrode 22 is referred to as a far end Ef. The main body part of the drain electrode 25 intersects with the near end En, but does not intersect with the far end Ef. The main body part of the drain electrode 25 does not reach the far end Ef, but ends at a position before the far end Ef by a distance L1 (on a side of the main body part of the pixel electrode 22). In contrast, the extension part of the pixel electrode 22 intersects with both the near end En and the far end Ef. The extension part of the pixel electrode 22 exceeds the far end Ef and ends beyond the far end Ef by a distance L2 (on a side opposite to the main body part of the pixel electrode 22).

With reference to the gate line 23, a side where the main body part of the pixel electrode 22 is disposed is referred to as a first side and the opposite side is referred to as a second side. The main body part of the pixel electrode 22 is formed on the first side of the gate line 23. The drain electrode 25 is formed on the first side of the gate line 23, but is not formed on the second side of the gate line 23. The extension part of the pixel electrode 22 is formed on the first side of the gate line 23 and is formed also on the second side of the gate line 23.

Hereinafter, a method for manufacturing the active matrix substrate 10 is described with reference to FIGS. 9A to 9I. (a) to (c) in FIG. 9A to 9I each show processes of forming the gate line 23, the data line 24, and the TFT 21. In the following description, thicknesses of a various kinds of films formed on the substrate are preferably decided in accordance with functions, materials, and the like of the films. The thickness of the films is about 10 nm to 1 μm, for example. An example of the thickness of the films is described below. For example, in a first process, a Ti film having a thickness of 25 to 35 nm, an Al film having a thickness of 180 to 220 nm, and a Ti film having a thickness of 90 to 110 nm are sequentially formed. In a second process, a SiNx film 121 having a thickness of 360 to 450 nm, an amorphous Si film 122 having a thickness of 100 to 200 nm, and an n+amorphous Si film 123 having a thickness of 30 to 80 nm are successively formed. A MoNb film having a thickness of 180 to 220 nm is formed in a third process, and an IZO film 141 having a thickness of 50 to 80 nm is formed in a fourth process. A lower SiNx film 151 having a thickness of 220 to 280 nm and an upper SiNx film 152 having a thickness of 450 to 550 nm are formed in a fifth process, and an IZO film having a thickness of 110 to 140 nm is formed in a sixth process.

Figure 9A:
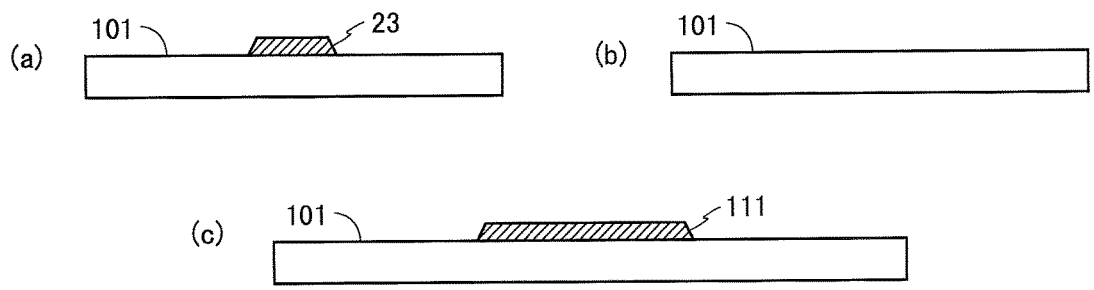
FIG. 9A is a diagram showing a method for manufacturing the active matrix substrate shown in FIG. 1.

(First Process) Formation of Gate Layer Pattern (FIG. 9A)

Ti (titanium), Al (aluminum), and Ti are formed successively on a Glass substrate 101 by sputtering. Subsequently, a gate layer is patterned using photolithography and etching to form the gate line 23, a gate electrode 111 of the TFT 21, and the like. Patterning using photolithography and etching refers to the following processing. First, a photoresist is applied to the substrate. Next, the substrate is covered with a photomask having an intended pattern and is exposed, thereby to make a photoresist having the same pattern as that of the photomask remain on the substrate. Subsequently, the substrate is etched using the remaining photoresist as a mask, to forma pattern on the surface of the substrate. Finally, the photoresist is peeled off.

Figure 9B:
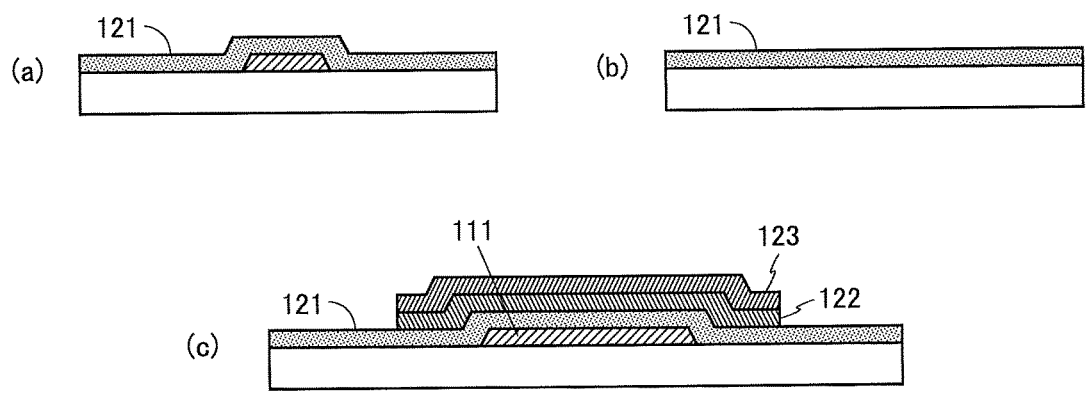
FIG. 9B is a diagram continued from FIG. 9A.

(Second Process) Formation of Semiconductor Layer (FIG. 9B)

The SiNx (silicon nitride) film 121 to be a Gate insulating film, the amorphous Si (amorphous silicon) film 122, and the n+amorphous Si film 123 doped with phosphorous are successively formed on the substrate shown in FIG. 9A by CVD (Chemical Vapor Deposition). Subsequently, a semiconductor layer is patterned using photolithography and etching, to form a semiconductor layer made up of the amorphous Si film 122 and the n+amorphous Si film 123 in an island shape on the gate electrode 111 of the TFT 21.

Figure 9C:
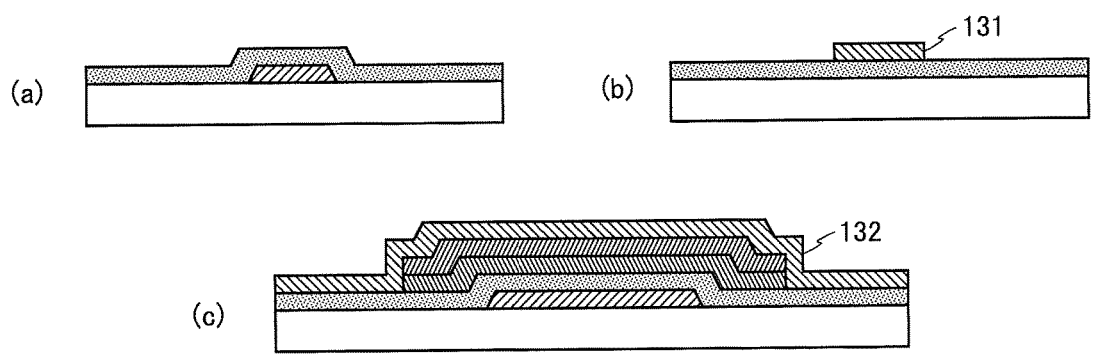
FIG. 9C is a diagram continued from FIG. 9B.

(Third Process) Formation of Source Layer Pattern (FIG. 9C)

The MoNb (molybdenum niobium) film is formed on the substrate shown in FIG. 9B by sputtering. Subsequently, a source layer is patterned using photolithography and etching to forma main conductor part 131 of the data line 24, a conductor part 132 of the TFT 21, and the like. The conductor part 132 of the TFT 21 is formed in the positions of the source electrode, the drain electrode, and a channel region of the TFT 21. When the third process is completed, the source electrode, the drain electrode, and the channel region of the TFT 21 are formed integrally with the main conductor part 131 of the data line 24.

(Fourth Process) Formation of Pixel Electrode (FIGS. 9D to 9G)

Figure 9D:
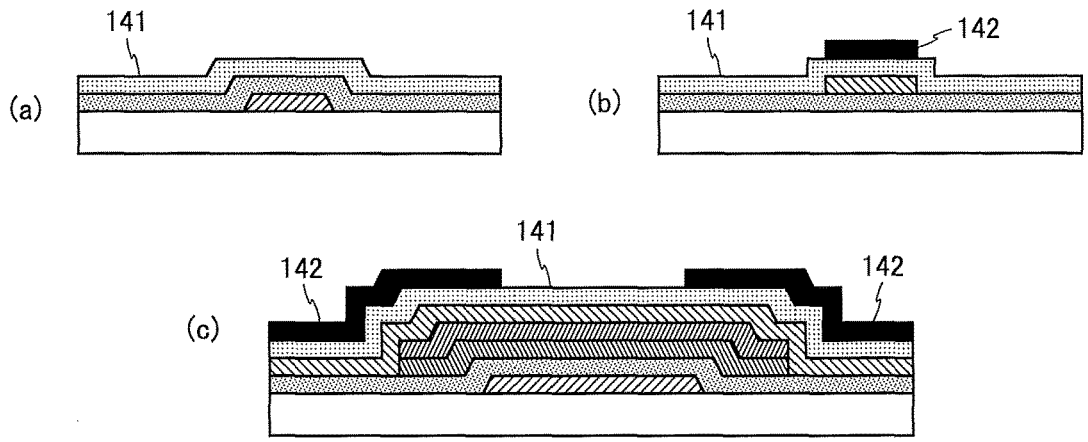
FIG. 9D is a diagram continued from FIG. 9C.
Figure 9E:
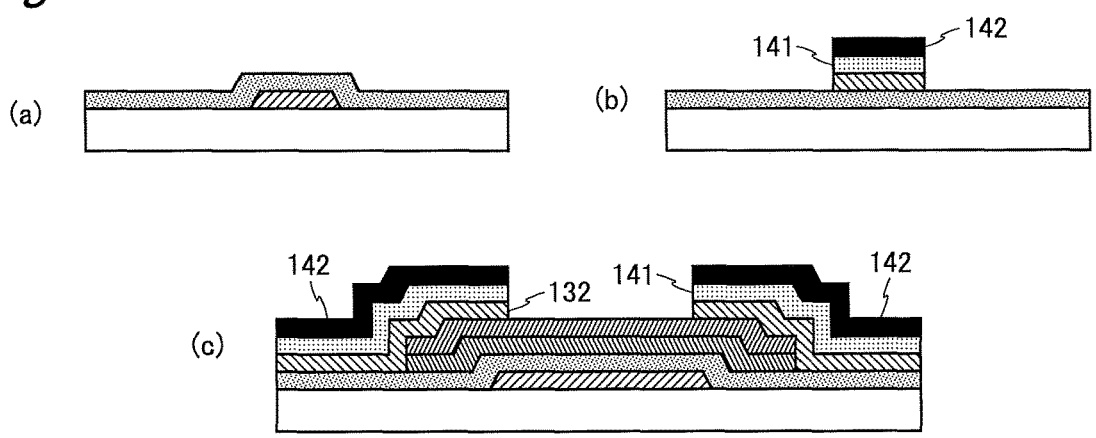
FIG. 9E is a diagram continued from FIG. 9D.
Figure 9F:
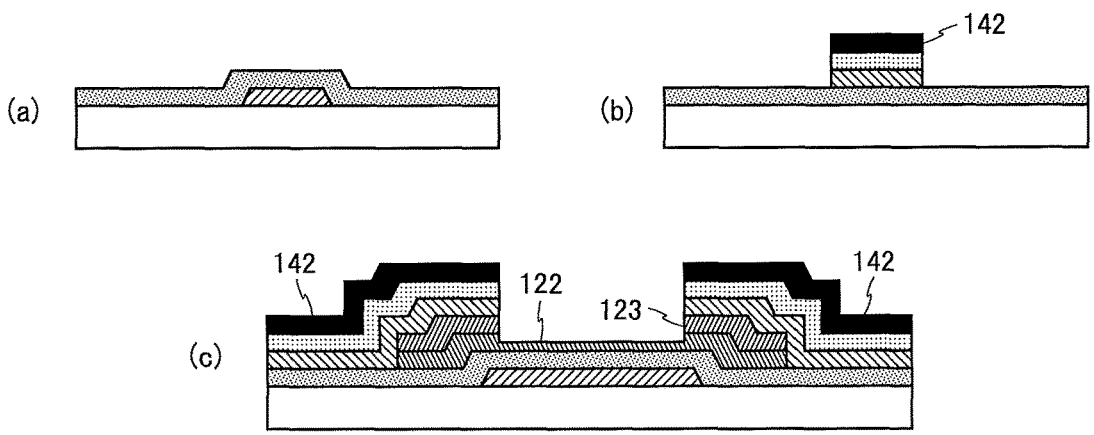
FIG. 9F is a diagram continued from FIG. 9E.

The IZO film 141 to be the pixel electrode 22 is formed on the substrate shown in FIG. 9C by sputtering. Subsequently, the pixel electrode layer is patterned using photolithography and etching. In the fourth process, there is used a photomask for making a photoresist 142 remain in the position of the pixel electrode 22 and the position of the source layer pattern (except for the position of the channel region of the TFT 21). For this reason, after exposure, the photoresist 142 remains in the position of the pixel electrode 22 and the position of the source layer pattern except for the position of the channel region of the TFT 21 (FIG. 9D). Using the photoresist 142 as a mask, the IZO film 141 and the conductor part 132 existing in the position of the channel region of the TFT 21 are at first etched by wet etching, and then the n+amorphous Si film 123 existing in the position of the channel region of the TFT 21 is etched by dry etching (FIGS. 9E and 9F). FIG. 9E shows a substrate when etching of the conductor part 132 is completed. FIG. 9F shows a substrate when etching of the n+amorphous Si film 123 is completed. As shown in FIG. 9F, a film thickness of the amorphous Si film 122 existing in the channel region of the TFT 21 becomes thin by dry etching. Finally, the photoresist 142 is peeled off to obtain a substrate shown in FIG. 9G. In the substrate shown in FIG. 9G, the channel region of the TFT 21 is formed, and a source electrode 143 and the drain electrode 25 of the TFT 21 come into a separate state. The IZO film 141 remains in a layer over the main conductor part 131 of the data line 24, the source electrode 143 of the TFT 21, and the drain electrode 25 of the TFT 21. The main conductor part 131 and the IZO film 141 in a layer thereover form the data line 24.

Figure 9G:
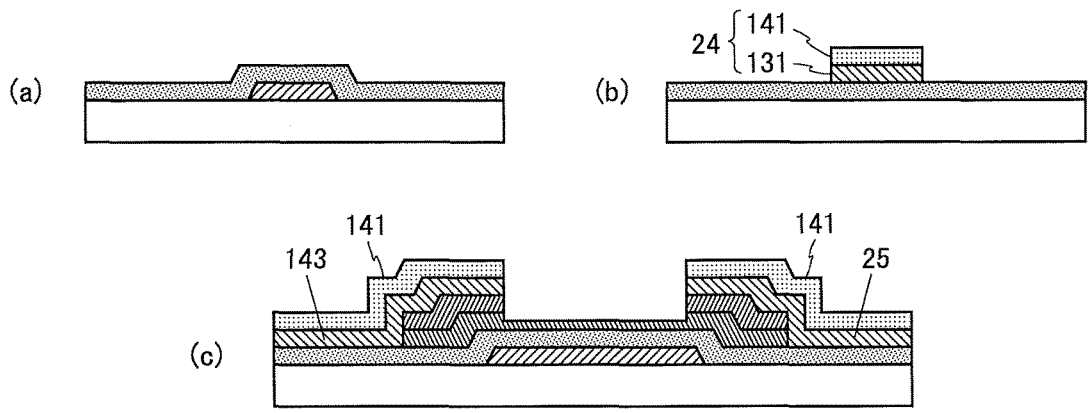
FIG. 9G is a diagram continued from FIG. 9F.
Figure 9H:
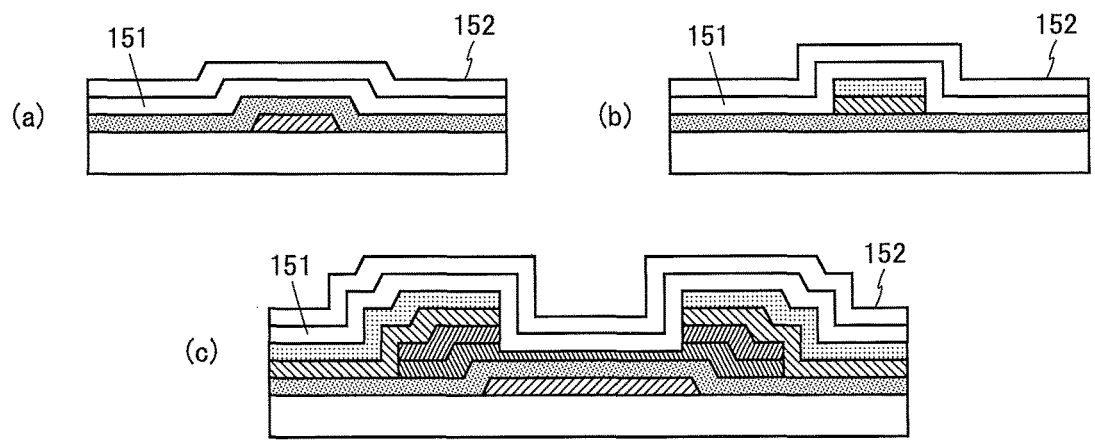
FIG. 9H is a diagram continued from FIG. 9G.

(Fifth Process) Formation of Protective Insulating Film (FIG. 9H)

The two-layered SiNx films 151, 152 to be the protective insulating film are sequentially formed on the substrate shown in FIG. 9G by CVD. Film formation conditions for the lower SiNx film 151 and film formation conditions for the upper SiNx film 152 are different. For example, a high-density thin film formed under a high temperature condition is used as the lower SiNx film 151, and a low-density thick film formed under a low temperature condition is used as the upper SiNx film 152. Subsequently, the two-layered SiNx films 151, 152 formed in the fifth process and the SiNx film 121 formed in the second process are patterned using photolithography and etching. Note that in FIG. 9H (a) to (c), specific patterning such as a contact hole is not performed on the protective insulating film. Patterning of the protective insulating film is performed in order to form a contact hole for connecting the gate layer or the source layer with the common electrode layer, and the like in the frame region 14 and the non-counter region 12.

Figure 9I:
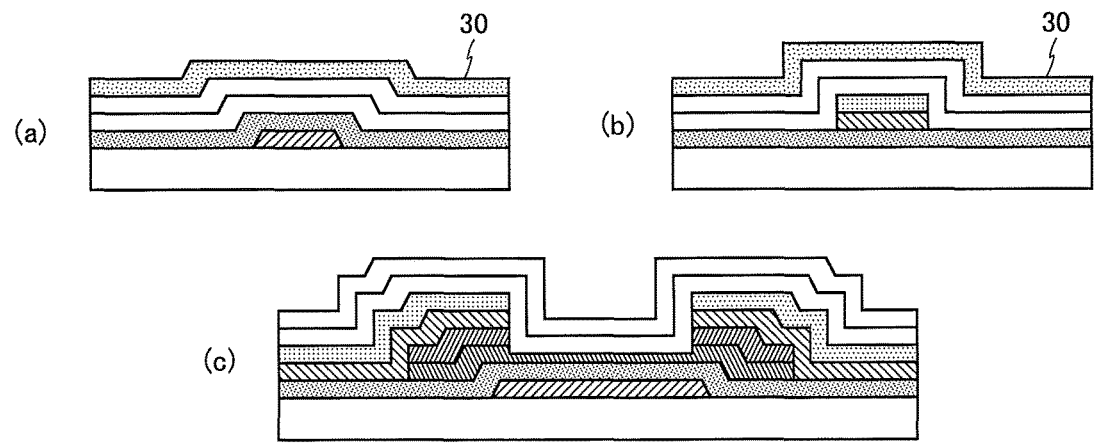
FIG. 9I is a diagram continued from FIG. 9H.

(Sixth Process) Formation of Common Electrode (FIG. 9I)

An IZO film to be the common electrode 30 is formed on the substrate shown in FIG. 9H by sputtering. Subsequently, a common electrode layer is patterned using photolithography and etching to form the common electrode 30.

By performing the first to sixth processes described above, it is possible to manufacture the active matrix substrate 10 having a sectional structure shown in FIG. 9I. In the manufacturing method according to the present embodiment, photolithography is performed using different photomasks in the first to sixth processes. The number of photomasks used in the manufacturing method according to the present embodiment is six in total. Shapes of the pixel electrode 22, the gate line 23 (including gate electrode), the data line 24 (including source electrode), the drain electrode 25, and the semiconductor layer 26 shown in FIG. 7 are determined by the photomasks used in the first to fourth processes. Therefore, by using the photomasks in accordance with the layout pattern shown in FIG. 7, the extension part of the pixel electrode 22 can be formed also on the second side of the gate line 23, without forming the drain electrode 25 on the second side of the gate line 23.

When the gate line 23 is formed in the first process and when the main conductor part 131 of the data line 24 is formed in the third process, Cu (copper), Mo (molybdenum), Al, Ti, TiN (titanium nitride), an alloy of these, or a laminated film of these metals may be used in place of the above materials. For example, as a wiring material for the gate line 23 and the main conductor part 131 of the data line 24, there may be used a three-layered film formed by laminating an Al alloy in a layer over MoNb, and further laminating MoNb in a layer over the Al alloy. Furthermore, when the pixel electrode 22 is formed in the fourth process and when the common electrode 30 is formed in the sixth process, another transparent conductive film such as ITO may be used in place of IZO. Furthermore, when the protective insulating film is formed in the fifth process, a one-layered SiNx film may be formed in place of the two-layered SiNx films. Alternatively, SiOx (silicon oxide) films, SiON (silicon oxy-nitride) films, or laminated films of these may be used in place of the SiNx films.

The counter substrate 40 is formed by forming, on the glass substrate, the black matrix 41 with the opening 42, forming a color filter layer and an overcoat layer thereon, and providing columnar spacers (not shown) in predetermined positions. Furthermore, each of the surface on the liquid crystal layer side of the active matrix substrate 10 and the surface on the liquid crystal layer side of the counter substrate 40 is provided with a horizontal alignment film (not shown), and is subjected to surface treatment for setting an initial alignment direction of liquid crystal molecules. The liquid crystal panel 2 can be configured by disposing the active matrix substrate 10 and the counter substrate 40 so as to face each other, and providing the liquid crystal layer between the two substrates.

Figure 10:
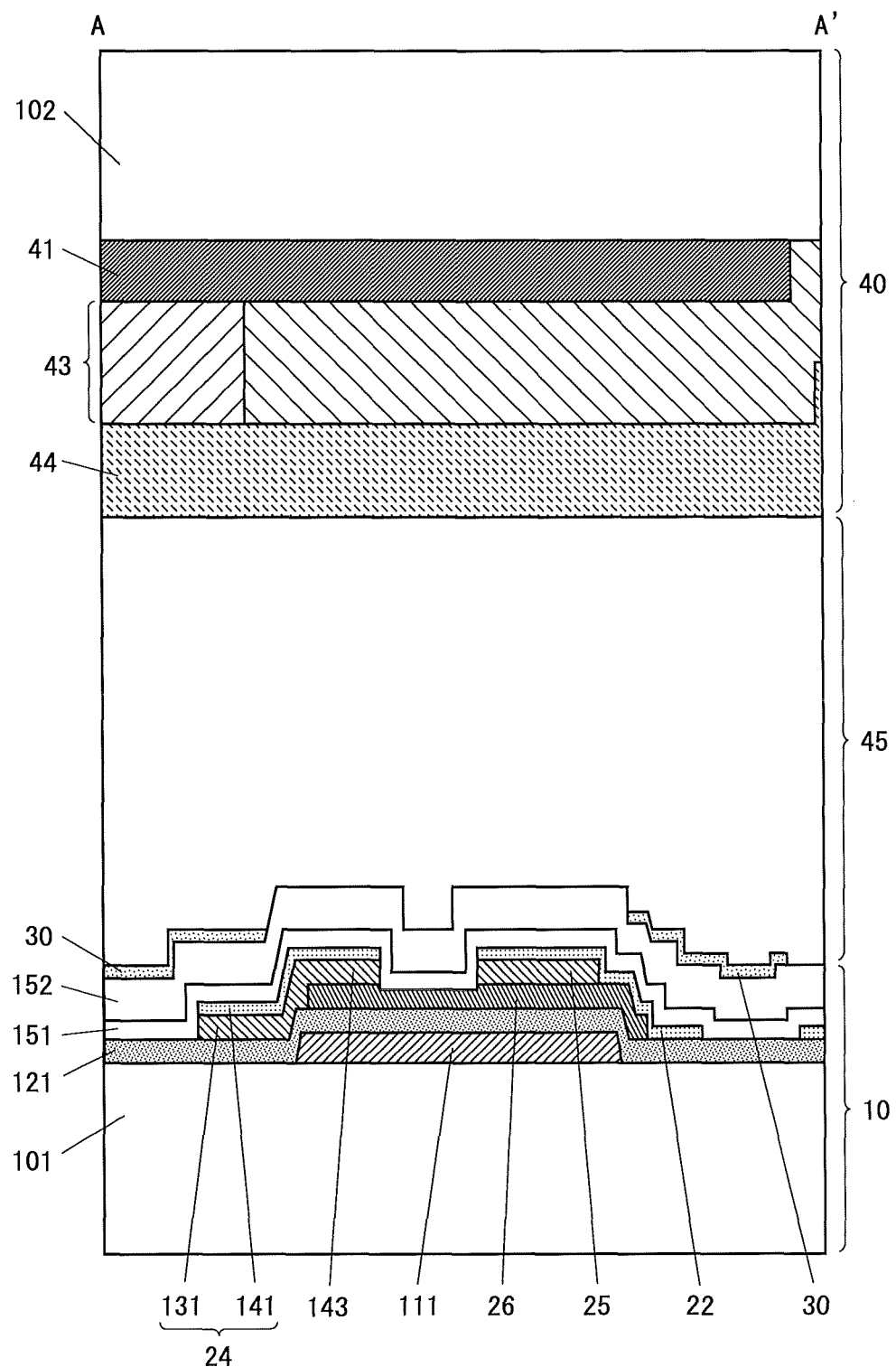
FIG. 10 is a sectional view of the liquid crystal panel shown in FIG. 1.

FIG. 10 is a sectional view of the liquid crystal panel 2. FIG. 10 shows a cross section taken along a line A-A' in FIG. 7. The active matrix substrate 10 has a following configuration on the line A-A'. At a predetermined position on the glass substrate 101, the gate electrode 111 of the TFT 21 is formed. The SiNx film 121 functioning as a gate insulating film is formed in a layer over the glass substrate 101 and the gate electrode 111. On the SiNx film 121 and on an A side (left side in the drawing) of the gate electrode 111, the data line 24 including the main conductor part 131 and the IZO film 141 is formed. The IZO film 141 is formed in a layer over the main conductor part 131 in the above-described fourth process together with the pixel electrode 22. The semiconductor layer 26 is formed at a predetermined position on the SiNx film 121, and the source electrode 143 and the drain electrode 25 are formed at predetermined positions on the semiconductor layer 26. The pixel electrode 22 is formed so as to cover the drain electrode 25. The SiNx films 151, 152 in two layers functioning as a protective insulating film are formed in a layer over the pixel electrode 22 and the data line 24. The common electrode 30 is formed at a predetermined position on the upper SiNx film 152.

As stated above, the drain electrode 25 is not formed on the second side of the gate line 23, whereas the extension part of the pixel electrode 22 is formed also on the second side of the gate line 23. In FIG. 10, an end (right end) of the drain electrode 25 is located in a range of the gate electrode 111 (left side of the right end of the gate electrode 111) in a plan view. An end (right end) of the pixel electrode 22 is located out of the range of the gate electrode 111 (right side of the right end of the gate electrode 111) in a plan view.

The black matrix 41 is formed on one surface of a glass substrate 102 of the counter substrate 40. A color filter layer 43 and an overcoat layer 44 are formed on the surface of the glass substrate 102 on which the black matrix 41 is formed. The active matrix substrate 10 and the counter substrate 40 are disposed so as to face each other, and a liquid crystal layer 45 is provided between the two substrates. Note that horizontal alignment films are omitted in FIG. 10.

Figure 11:
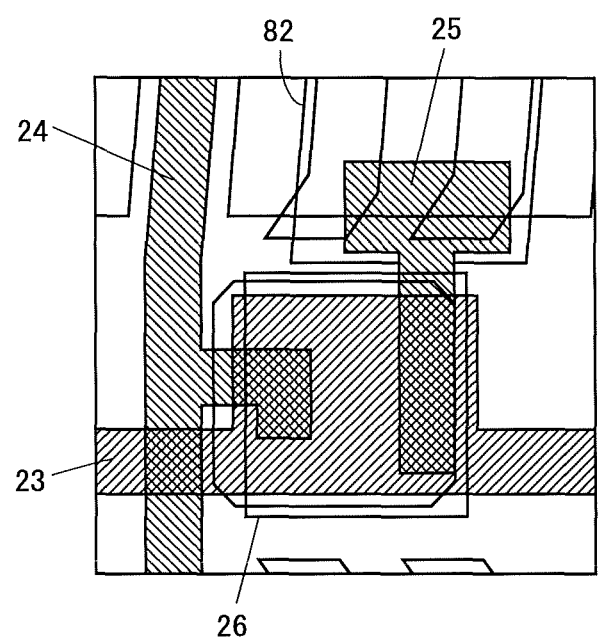
FIG. 11 is a layout diagram of a liquid crystal panel including an active matrix substrate according to a comparative example.

Effects of the active matrix substrate 10 according to the present embodiment will be described below. FIG. 11 is a layout diagram of a liquid crystal display device including an active matrix substrate according to a comparative example. In FIG. 11, the shapes of the gate line 23, the data line 24, the drain electrode 25, and the semiconductor layer 26 are the same as those in FIG. 7, and a shape of a pixel electrode 82 is different from that in FIG. 7. In FIG. 11, the extension part of the pixel electrode 82 ends at a same position as the main body part of the drain electrode 25.

In the active matrix substrate according to the comparative example, the extension part of the pixel electrode 82 is not formed on the second side of the gate line 23. Thus, when positions of the pixel electrode 82 and the drain electrode 25 are shifted upward slightly, an area of a portion where the gate line 23 and the main body part of the drain electrode 25 overlap is decreased, a parasitic capacitance Cad between the gate and the drain of the TFT is decreased, and a feed-through voltage is decreased. Furthermore, when the positions of the pixel electrode 82 and the drain electrode 25 are shifted downward slightly, the area of the portion where the gate line 23 and the main body part of the drain electrode 25 overlap is increased, the parasitic capacitance Cgd between the gate and the drain of the TFT is increased, and the feed-through voltage is increased.

In the liquid crystal display device having the active matrix substrate according to the comparative example, since a variation occurs in the parasitic capacitance Cgd between the gate and the drain of the TFT due to a pattern shift, when a fluctuation amount of the feed-through voltage differs among the pixel circuits, display quality is degraded. For example, when the pixel electrode and the gate line are formed using a step-and-repeat method, block-shaped display unevenness occurs in a display screen, and when the pixel electrode and the gate line are formed using a scanning exposure method, bar-like display unevenness and a flicker occur in the display screen.

In contrast, in the active matrix substrate 10, the extension part of the pixel electrode 22 is formed also on the second side of the gate line 23. Thus, when the positions of the pixel electrode 22 and the drain electrode 25 are shifted upward or downward by a predetermined amount or less, although the area of the portion where the gate line 23 and the main body part of the drain electrode 25 overlap changes, an area of a portion where the gate line 23 and the extension part of the pixel electrode 22 overlap does not change. Thus, among the pixel circuits 20, the parasitic capacitance Cgd between the gate and the drain of the TFT 21 becomes approximately equal, and the feed-through voltage becomes approximately equal. Therefore, according to the liquid crystal display device including the active matrix substrate 10, degradation of display quality due to the variation in the parasitic capacitance Cgd between the gate and the drain of the TFT 21 can be prevented.

Furthermore, in the active matrix substrate 10, the extension part of the pixel electrode 22 is formed also on the second side of the gate line 23, whereas the drain electrode 25 is not formed on the second side of the gate line 23. Thus, as described below, it is possible to prevent display defects due to a defect in a rubbing process, a fluctuation in an aperture ratio, and an influence of light from the backlight.

When manufacturing the liquid crystal display device, the rubbing process is performed to set an initial alignment of liquid crystal molecules. When liquid crystal has a negative dielectric anisotropy, the rubbing process is performed so that lona axes of the liquid crystal molecules are aligned in a direction approximately perpendicular to an extending direction of the slit of the common electrode (horizontal direction in FIG. 3, extending direction of the gate line 23). When the liquid crystal has a positive dielectric anisotropy, the rubbing process is performed so that the long axes of the liquid crystal molecules are aligned in the extending direction of the slit of the common electrode (vertical direction in FIG. 3, extending direction of the data line 24). When a step difference is large in a vicinity of the TFT, the defect in the rubbing process is likely to occur. In the active matrix substrate 10, since the step difference is small in the vicinity of the TFT 21, the defect in the rubbing process is hard to occur.

Furthermore, when manufacturing the liquid crystal display device, a shift occurs when the active matrix substrate and the counter substrate are attached, and a position of the black matrix may be shifted. In a case where the drain electrode 25 is formed also on the second side of the gate line 23, when an attachment shift between the substrates occurs, the main body part of the drain electrode 25 overlaps with the opening 42 of the black matrix 41, and the aperture ratio may be decreased. This is because the drain electrode 25 is formed of an opaque metal material such as MoNb. In the active matrix substrate 10, since the opaque drain electrode 25 is not formed on the second side of the gate line 23 and a transparent conductive film such as IZO is formed on the second side of the gate line 23, the aperture ratio is hard to fluctuate even when the shift occurs in attaching the substrates. Furthermore, when the liquid crystal display device 1 is used outdoors or the like, the display defect due to a reflection of external light on the drain electrode 25 is hard to occur.

Furthermore, in the liquid crystal display device, the light from the backlight may be reflected to a back surface (side on which the backlight is disposed) of the drain electrode and may be incident on the channel region of the TFT. When the light from the backlight is incident on the channel region of the TFT, charge may escape through the TFT in a period where a voltage applied to the liquid crystal layer is to be retained, and the display defect may occur. In the active matrix substrate 10, since the drain electrode 25 is not formed on the second side of the gate line 23, the display defect due to the influence of the light from the backlight can be prevented.

When manufacturing the active matrix substrate 10, it is preferable that the channel region of the TFT 21 be formed by patterning the conductor part 132 and the semiconductor layer of the TFT 21 using a photomask for forming the pixel electrode 22 in the fourth process. When the pixel electrode and the channel region of the TFT are formed in different processes, it necessary to provide a design margin (margin against a position shift in a photolithography process, and a variation in a finished width in an etching process) between a pattern of the pixel electrode layer and a pattern for forming the channel region of the TFT. Thus, it becomes necessary to make an area of the drain electrode more than necessary (for example, 1 to 2 μm larger for each side), the parasitic capacitance Cgd between the gate and the drain of the TFT is increased, and a load (capacitance) of the gate line becomes large.

In the manufacturing method according to the present embodiment, although it necessary to enlarge a pattern of a portion to be the drain electrode 25 later (conductor part 132 of TFT 21) in the third process, a size of the drain electrode 25 is determined finally in the fourth process. Therefore, according to the manufacturing method according to the present embodiment, it is possible to suppress an increase in the parasitic capacitance Cgd between the gate and the drain of the TFT 21, without enlarging the drain electrode 25 more than necessary.

As described above, the active matrix substrate 10 according to the present embodiment includes a plurality of the gate lines 23 extending in a first direction (row direction), a plurality of the data lines 24 extending in a second direction (column direction), a plurality of the pixel circuits 20 arranged corresponding to the intersections of the gate lines 23 and the data lines 24 and each including a thin film transistor (TFT 21) and the pixel electrode 22, a protective insulating film (SiNx films 151, 152) formed in a layer over the gate line 23, the data line 24, the thin film transistor, and the pixel electrode 22, and the common electrode 30 formed in a layer over the protective insulating film. The thin film transistor has the gate electrode integrally formed with the gate line 23, the source electrode formed integrally with the data line 24, and the drain electrode 25 directly connected to the pixel electrode 22 and having the overlapping portion with the gate electrode. The pixel electrode 22 has the main body part formed on the first side (upper side) of the gate line 23, and the extension part extending in the second direction and covering the overlapping portion of the gate electrode and the drain electrode 25. The drain electrode 25 is not formed on the second side (lower side) of the gate line 23, whereas the extension part of the pixel electrode 22 is formed also on the second side of the gate line 23.

According to the active matrix substrate 10 according to the present embodiment, by forming the extension part of the pixel electrode 22 also on the second side of the gate line 23, even when the positions of the pixel electrode 22 and the drain electrode 25 are shifted in the second direction to some extent, the area of the portion where the gate line 23 and the extension part of the pixel electrode 22 overlap does not change. Thus, among the pixel circuits 20, the parasitic capacitance Cgd between the gate and the drain of the thin film transistor is approximately equal, and the feed-through voltage is approximately equal. Therefore, degradation of display quality due to the variation in the parasitic capacitance Cgd between the gate and the drain of the thin film transistor can be prevented. Furthermore, since the drain electrode 25 is not formed on the second side of the gate line 23, the display defects due to the defect in the rubbing process, the fluctuation in the aperture ratio, and the influence of the light from the backlight can be prevented.

Furthermore, the common electrode 30 has one or more (two) slits 31 corresponding to the pixel circuit 20. With this, it is possible to generate the lateral electric field for widening the view angle of the liquid crystal panel 2 including the active matrix substrate 10. Furthermore, the liquid crystal panel 2 according to the present embodiment includes the active matrix substrate 10, and the counter substrate 40 facing the active matrix substrate 10. With this, it is possible to configure a liquid crystal panel which prevents degradation of display quality due to the variation in the parasitic capacitance Cgd between the gate and the drain of the thin film transistor.

Furthermore, the method for manufacturing the active matrix substrate 10 includes a step (first process) for forming a plurality of the gate lines 23 extending in the first direction (row direction), and concurrently forming the gate electrode of the thin film transistor (TFT 21) integrally with the gate line 23, a semiconductor layer forming step (second process) for forming the semiconductor layer 26 of the thin film transistor, a source layer forming step (third process) for forming the main conductor part 131 of the plurality of the data lines 24 extending in the second direction (column direction), and concurrently forming the conductor part 132 to be a base of the drain electrode 25 and the source electrode of the thin film transistor, integrally with the main conductor part 131, a pixel electrode layer forming step (fourth process) for forming the pixel electrode 22 and an accessory conductor part (IZO film 141 in a layer over the main conductor part 131) of the data line, and concurrently patterning the conductor part 132 to form the drain electrode 25 and the source electrode of the thin film transistor, a process (fifth process) for forming the protective insulating film (SiNx films 151, 152) in a layer over the pixel electrode 22, and a process (sixth process) for forming the common electrode 30 in a layer over the protective insulating film. In the source layer forming step and the pixel electrode layer forming step, the drain electrode 25 is formed so as to have the overlapping portion with the gate electrode. In the pixel electrode layer forming step, the pixel electrode 22 having the main body part formed on the first side (upper side) of the gate line 23 and the extension part extending in the second direction and covering the overlapping portion of the gate electrode and the drain electrode 25 is formed directly connected to the drain electrode 25. In the source layer forming step and the pixel electrode layer forming step, the drain electrode 25 is not formed on the second side of the gate line 23, and in the pixel electrode layer forming step, the extension part of the pixel electrode 22 is formed also on the second side of the gate line 23. In the semiconductor layer forming step, a semiconductor film (amorphous Si film 122 and n+amorphous Si film 123) is formed, and the semiconductor film is patterned. With this, it is possible to manufacture the active matrix substrate 10 which prevents degradation of display quality due to the variation in the parasitic capacitance Cgd between the gate and the drain of the thin film transistor. Furthermore, by forming the drain electrode 25 of the thin film transistor in the pixel electrode layer forming step, it is possible to suppress an increase in the parasitic capacitance between the gate and the drain of the thin film transistor, without enlarging the drain electrode 25 more than necessary.

Figure 12:
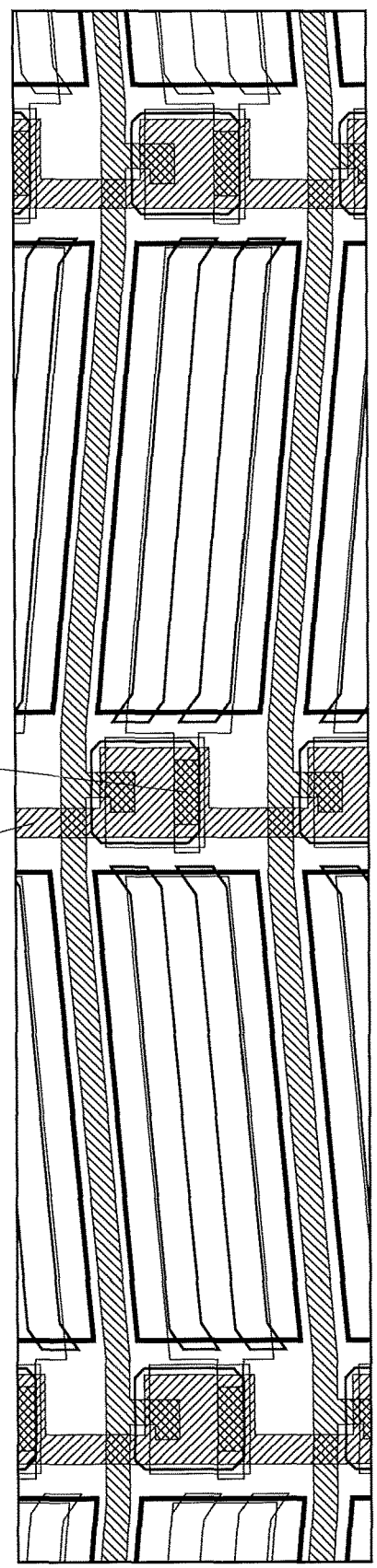
FIG. 12 is a layout diagram of a liquid crystal panel including an active matrix substrate according to a first variant of the first embodiment.

As for the active matrix substrate 10 according to the present embodiment, following variants can be configured. FIG. 12 is a layout diagram of a liquid crystal panel including an active matrix substrate according to a first variant. In FIG. 12, a drain electrode 51 having a main body part and not having a connecting part is used in place of the drain electrode 25 shown in FIG. 4. The drain electrode 51 does not intersect with either the near end En or the far end Ef of the gate line 23. The drain electrode 51 is not formed either on the first side or on the second side of the gate line 23, and is formed in a region where the gate line 23 and the gate electrode are formed. According to the active matrix substrate according to the first variant, even when an attachment shift occurs between the substrates and an opening of a black matrix is formed close to the TFT, it is possible to prevent the drain electrode and the opening of the black matrix from overlapping, and prevent a decrease in the aperture ratio. Furthermore, the display defect due to the influence of the light from the backlight can be prevented more effectively.

Figure 13:
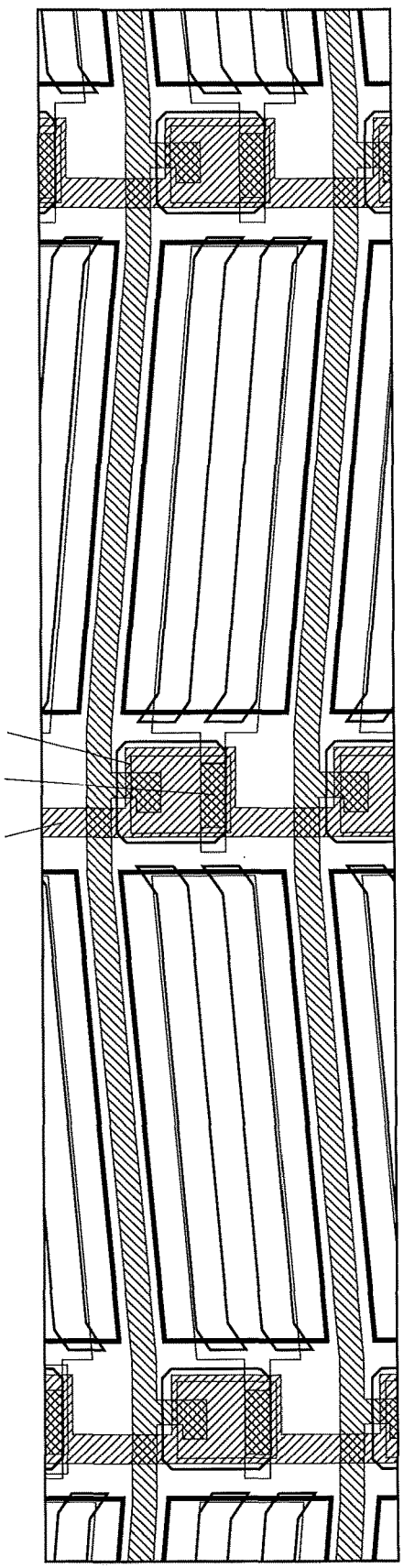
FIG. 13 is a layout diagram of a liquid crystal panel including an active matrix substrate according to a second variant of the first embodiment.

FIG. 13 is a layout diagram of a liquid crystal panel including an active matrix substrate according to a second variant. In FIG. 13, a semiconductor layer 52 smaller than the semiconductor layer 26 is used in place of the semiconductor layer 26 shown in FIG. 4. The semiconductor layer 52 is formed in the region where the gate line 23 and the gate electrode are formed. With this, the display defect due to the influence of the light from the backlight can be prevented. However, in the active matrix substrate according to the second variant, since a position shift when forming the semiconductor layer in the second process has a large influence on characteristics of the TFT, it is necessary to enlarge an area of the gate electrode in advance. Thus, when designing the active matrix substrate, it may be determined to select either the layout shown in FIG. 4 or the layout shown in FIG. 12, considering an accuracy of an exposure apparatus, luminance of the backlight, a design of the pixel circuit (such as size of securable auxiliary capacitor), an output voltage of the drive circuit, and the like.

Figure 14:
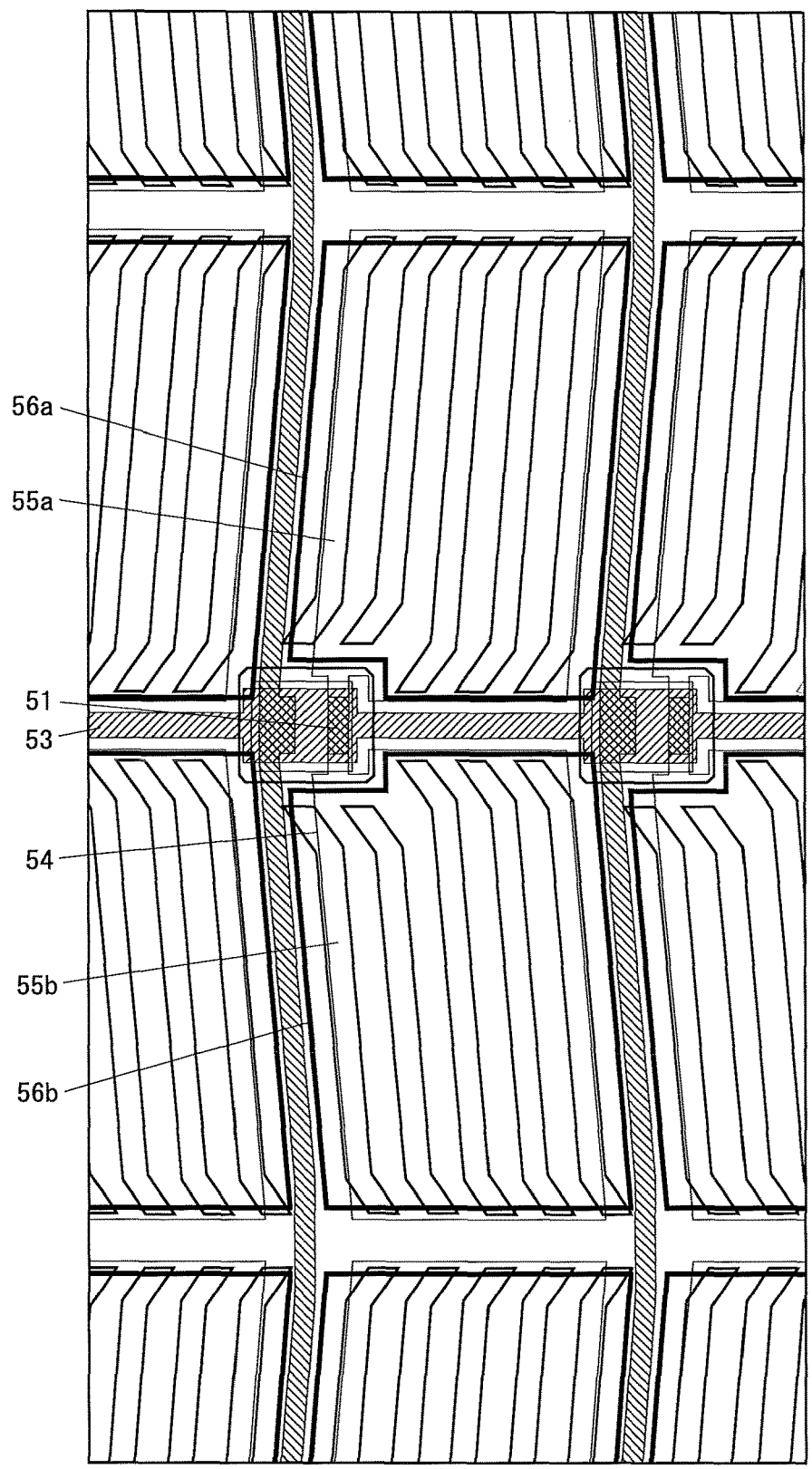
FIG. 14 is a layout diagram of a liquid crystal panel including an active matrix substrate according to a third variant of the first embodiment.
Figure 15:
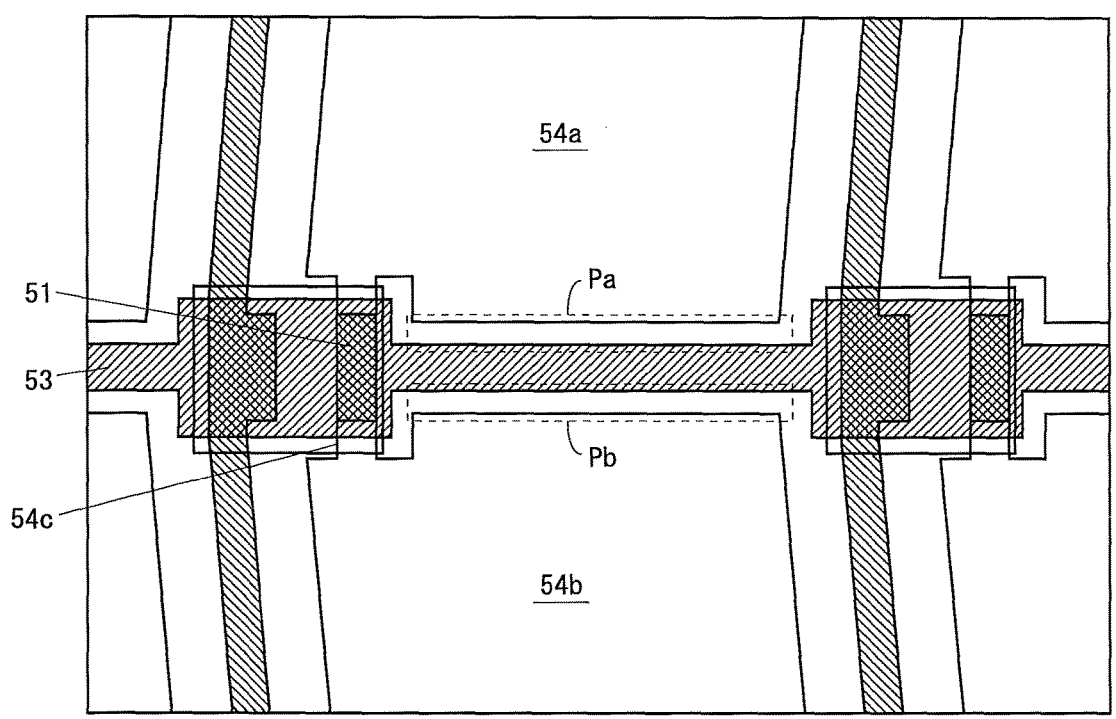
FIG. 15 is an enlarged view of FIG. 14.

FIG. 14 is a layout diagram of a liquid crystal panel including an active matrix substrate according to a third variant. In the active matrix substrate according to the third variant, a pixel size is larger than those of the active matrix substrates shown in FIGS. 4, 12, and 13. For example, when the pixel size in FIGS. 4, 12, and 13 is 21×63 µm, the pixel size in FIG. 14 is 42×126 µm. FIG. 15 is an enlarged view of FIG. 14. FIG. 15 shows patterns other than a pattern of the common electrode of the active matrix substrate according to the third variant.

As shown in FIG. 14, a gate line 53 passes through the pixel circuit, and the pixel circuit is divided into two by the gate line 53. In FIG. 14, an upper side of the gate line 53 is referred to as a first side, and a lower side of the gate line 53 is referred to as a second side. A pixel electrode 54 has a first main body part 54a formed on the first side, a second main body part 54b formed on the second side, an extension part 54c extending in the column direction, covering the overlapping portion of the gate electrode and the drain electrode 51, and connecting the first main body part 54a and the second main body part 54b (refer to FIG. 15). The common electrode has five slits 55a formed on the first side and five slits 55b formed on the second side, corresponding to one pixel circuit. A black matrix has an opening 56a formed on the first side and an opening 56b formed on the second side, corresponding to one pixel circuit.

Here, the slit 55a and the slit 55b may be formed as a series of slits. However, in this configuration, since the slit is formed also on the gate line 53, an electric field generated by a voltage applied to the gate line 53 may affect an alignment of liquid crystal. Thus, as shown in FIG. 14, a configuration in which no slit is formed on the gate line 53 is preferable. When the common electrode has one or more slits in a region corresponding to the first main body part 54a and the second main body part 54b, it is preferable that at least one slit be not formed above the gate line 53. With this, it is possible to generate the lateral electric field for widening the view angle of the liquid crystal panel including the active matrix substrate, while preventing the electric field generated by the voltage applied to the gate line 53 from affecting the alignment of the liquid crystal.

Although the gate line 53 and the main body parts of the pixel electrode 54 do not overlap as shown in FIGS. 14 and 15, a parasitic capacitance generated by an oblique electric field occurs between the gate line 53 and the pixel electrode 54. The parasitic capacitance generated between the gate line 53 and the pixel electrode 54 in each pixel circuit is a sum of a first capacitance (capacitance generated at Pa part in FIG. 15) generated between the gate line 53 and the first main body part 54a, and a second capacitance (capacitance generated at Pb part in FIG. 15) generated between the gate line 53 and the second main body part 54b.

In the active matrix substrate according to the third variant, when a position of the pixel electrode 54 is shift upward, since the first main body part 54a becomes farther from the gate line 53 and the second main body part 54b becomes closer to the gate line 53, the first capacitance becomes smaller and the second capacitance becomes larger. In contrast, when the position of the pixel electrode 54 is shifted downward, since the first main body part 54a becomes closer to the gate line 53 and the second main body part 54b becomes farther from the gate line 53, the first capacitance becomes larger and the capacitance becomes smaller. Therefore, according to the active matrix substrate according to the third variant, even when the position of the pixel electrode 54 is shifted from a position of the gate line 53, an amount of the parasitic capacitance generated between the gate line 53 and the pixel electrode 54 can be kept approximately constant. However, in the active matrix substrate according to the third variant, the parasitic capacitance generated between the gate line 53 and the pixel electrode 54 is larger than that in a configuration in which the second main body part is not formed on the second side. Thus, when designing the active matrix substrate, it may be determined whether to select the layout shown in FIG. 14, with considering the accuracy of the exposure apparatus or the like.

Figure 16:
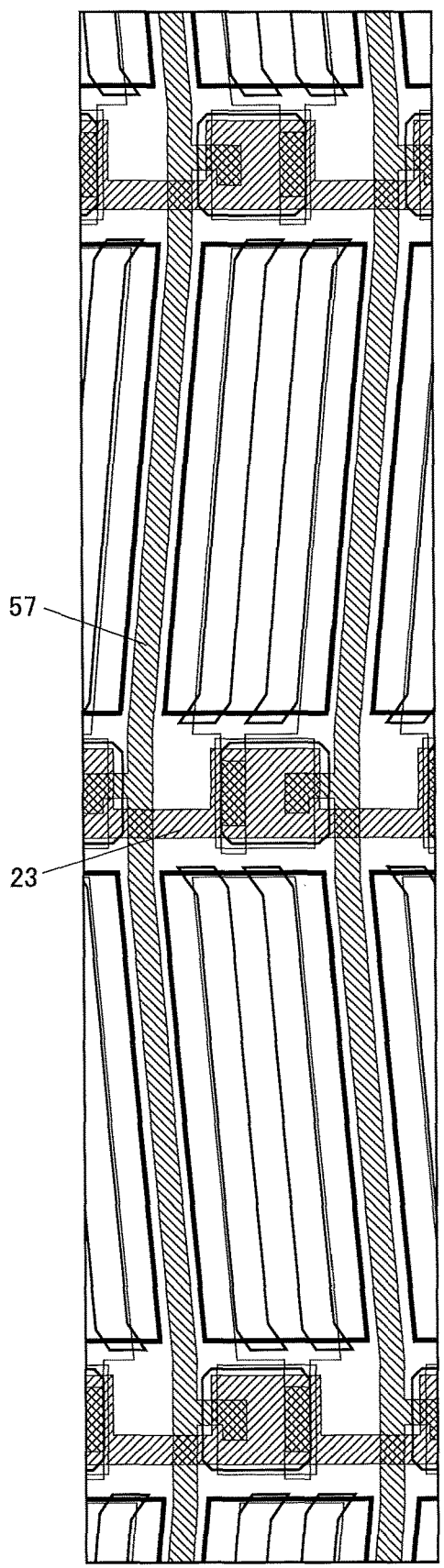
FIG. 16 is a layout diagram of a liquid crystal panel including an active matrix substrate according to a fourth variant of the first embodiment.

FIG. 16 is a layout diagram of a liquid crystal panel including an active matrix substrate according to a fourth variant. In FIG. 16, a data line 57 has a portion functioning as the source electrode of the TFT, in a vicinity of an intersection of the gate line 23 and the data line 57. However, the source electrodes are formed on both sides of the data line 57 alternately. Thus, the TFTs are formed on both sides of the data line 57 alternately. According to the active matrix substrate according to the fourth variant, same effects as those attained by the active matrix substrate 10 according to the first embodiment can also be attained. The active matrix substrate according to the fourth variant can be used suitably for a liquid crystal display device performing a dot inversion drive, without increasing the load of the data line 57.

Second Embodiment

Figure 17:
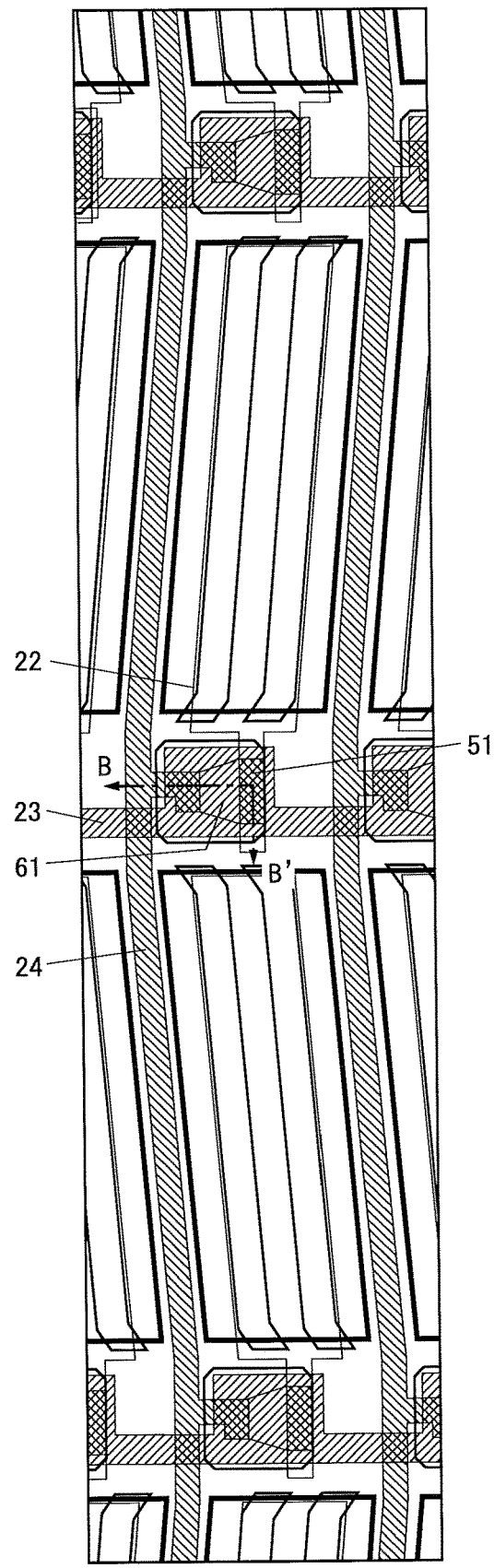
FIG. 17 is a layout diagram of a liquid crystal panel including an active matrix substrate according to a second embodiment of the present invention.

In a second embodiment, an active matrix substrate manufactured by a method different from that of the first embodiment will be described. FIG. 17 is a layout diagram of a liquid crystal panel having the active matrix substrate according to the second embodiment of the present invention. In FIG. 17, the shapes of the pixel electrode 22, the gate line 23, the data line 24, and the drain electrode 51 are the same as those in FIG. 12, and a shape of a semiconductor layer 61 is different from that in FIG. 12. The semiconductor layer 61 is formed between the source electrode integrally formed with the data line 24, and the drain electrode 51. In addition, the semiconductor layer 61 is formed in an approximately same shape as the source layer pattern in a layer under the source layer pattern. Specifically, the semiconductor layer 61 is formed also in a layer under the data line 24, the source electrode of the TFT, and the drain electrode 51.

In the manufacturing method according to the present embodiment, the first process described in the first embodiment is executed, then second and third processes described below are executed, and then the fourth to sixth processes described in the first embodiment are executed. In the following, the second and third processes of the manufacturing method according to the present embodiment will be described with reference to FIGS. 18A to 18D. Note that the same elements as those in the first embodiment are provided with the same reference numerals, and descriptions thereof are omitted.

Figure 18A:
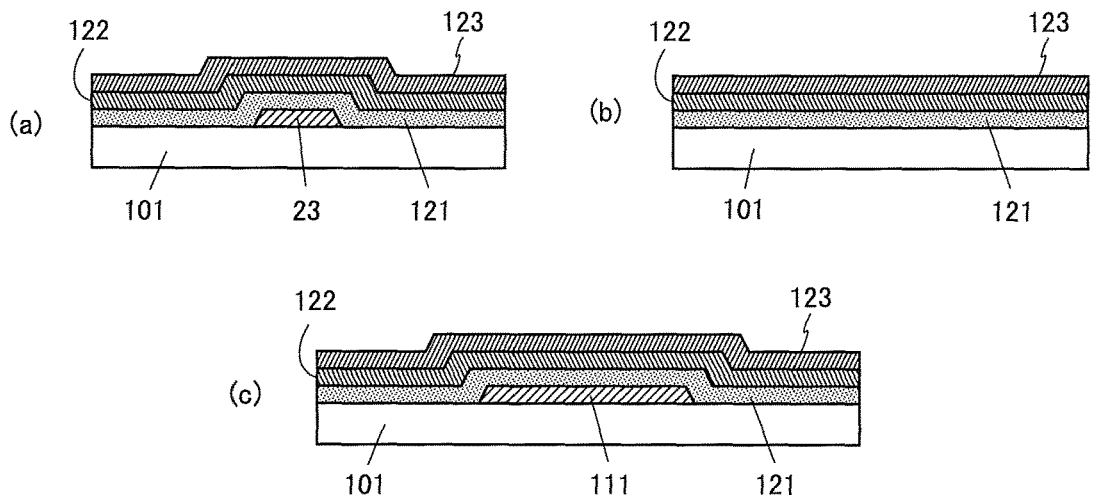
FIG. 18A is a diagram showing a method for manufacturing the active matrix substrate according to the second embodiment.

(Second Process) Formation of Semiconductor Layer (FIG. 18A)

The SiNx film 121 to be a gate insulating film, the amorphous Si film 122, and the n+amorphous Si film 123 doped with phosphorous are successively formed on the substrate shown in FIG. 9A by CVD. Unlike the first embodiment, in the present embodiment, the semiconductor layer is not patterned. The patterning of the semiconductor layer is performed together with patterning of the source layer in the third process.

Figure 18B:
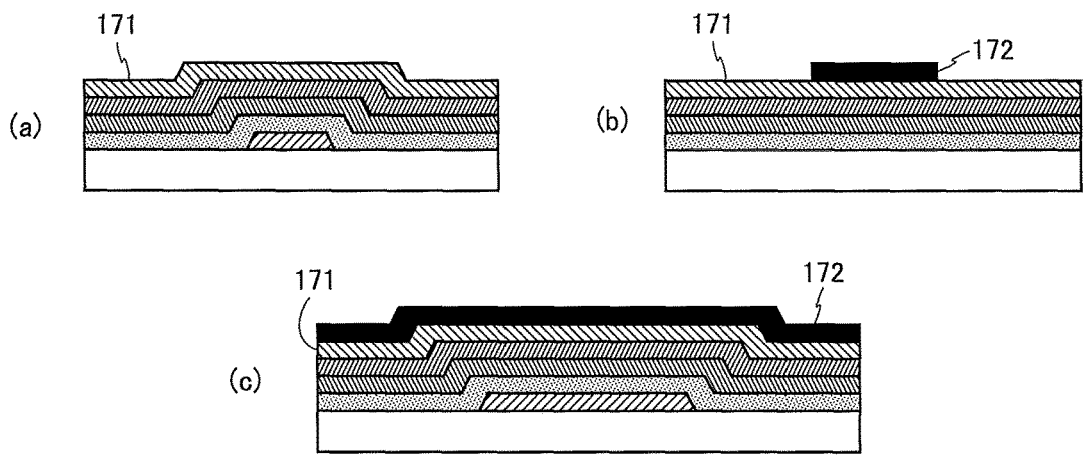
FIG. 18B is a diagram continued from FIG. 18A.
Figure 18C:
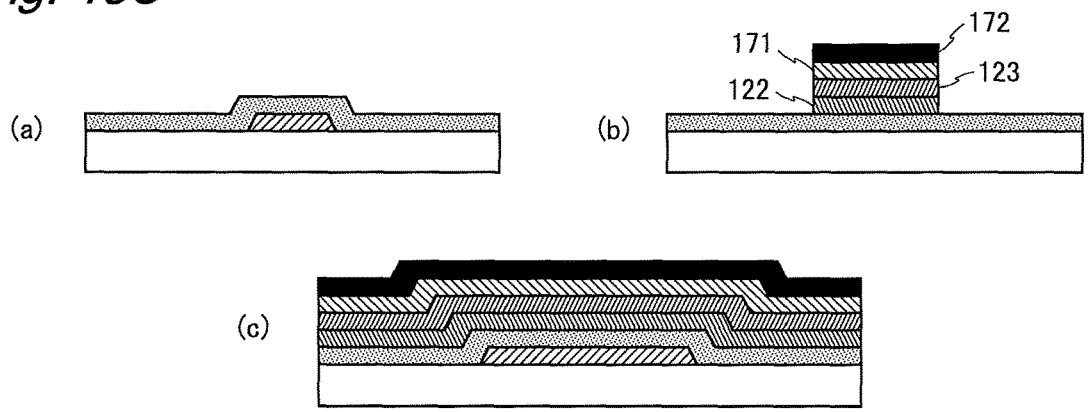
FIG. 18C is a diagram continued from FIG. 18B.
Figure 18D:
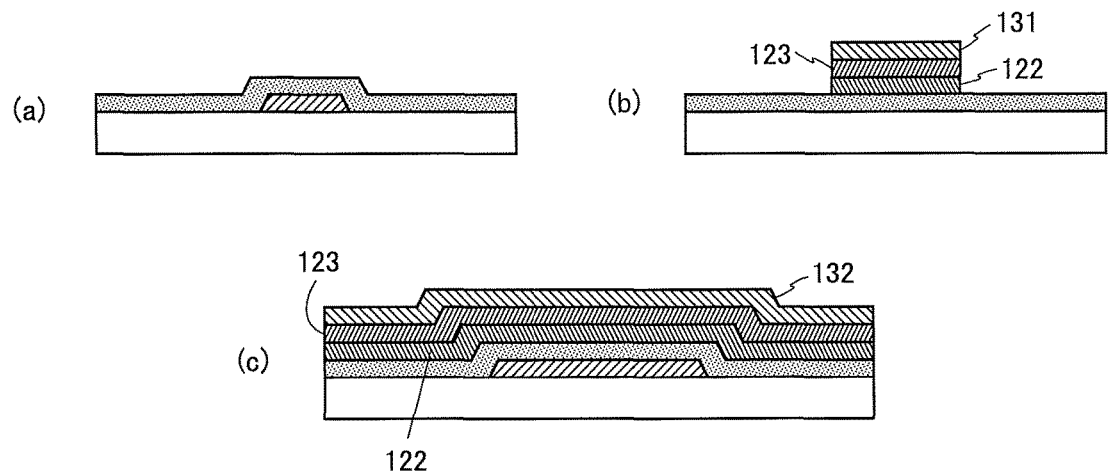
FIG. 18D is a diagram continued from FIG. 18C.

(Third Process) Formation of Source Layer Pattern (FIGS. 18B to 18D)

A MoNb film 171 is formed on the substrate shown in FIG. 18A by sputtering. Subsequently, the source layer and the semiconductor layer are patterned using photolithography and etching to form the main conductor part 131 of the data line 24, the conductor part 132 of the TFT 21, and the like. The conductor part 132 of the TFT 21 is formed in the positions of the source electrode, the drain electrode, and the channel region of the TFT 21. In the third process, there is used a photomask for making a photoresist 172 remain in the positions of the main conductor part 131, the conductor part 132, and the like. For this reason, after exposure, the photoresist 172 remains in the positions of the main conductor part 131, the conductor part 132, and the like (FIG. 18B). Using the photoresist 172 as a mask, the MoNb film 171 formed in the third process is at first etched, and then the n+amorphous Si film 123 and the amorphous Si film 122 formed in the second process are etched successively (FIG. 18C). The amorphous Si film 122 and the n+amorphous Si film 123 are thereby patterned in almost the same shape as that of the source layer. Finally, the photoresist 172 is peeled off to obtain a substrate shown in FIG. 18D. In the substrate shown in FIG. 18D, the remaining unetched MoNb film 171 becomes the main conductor part 131 of the data line 24, the conductor part 132 of the TFT 21, and the like. The substrate shown in FIG. 18D corresponds to the substrate shown in FIG. 9G. The substrate shown in FIG. 18D is different from the substrate shown in FIG. 9C in that the amorphous Si film 122 and the n+amorphous Si film 123 exist in a layer under the main conductor part 131 of the data line 24.

Figure 18E:
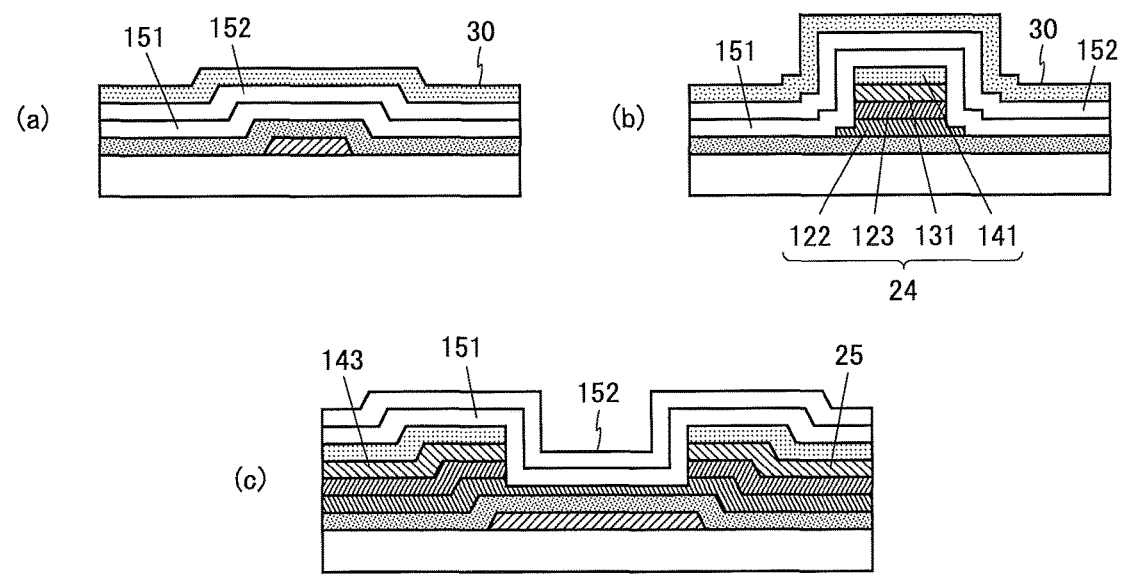
FIG. 18E is a sectional view of elements formed on the active matrix substrate according to the second embodiment.

By performing the fourth to sixth processes described in the first embodiment on the substrate shown in FIG. 18D, it is possible to manufacture the active matrix substrate having a sectional structure shown in FIG. 18E. A liquid crystal panel according to the present embodiment can be configured by disposing the active matrix substrate and the counter substrate 40 so as to face each other and providing a liquid crystal layer between the two substrates.

Note that in the method for manufacturing the active matrix substrate according to the present embodiment, when the gate line 23 is formed in the first process and when the main conductor part 131 of the data line 24 is formed in the third process, Cu, Mo, Al, Ti, an alloy of these, or a laminated film of these metals may be used. Furthermore, when the pixel electrode 22 is formed in the fourth process and when the common electrode 30 is formed in the sixth process, a transparent conductive film such as ITO may be used. Furthermore, when the protective insulating film is formed in the fifth process, a one-layered SiNx film may be formed, or SiOx films, SiON films, or a laminated film of these may be used.

Figure 19:
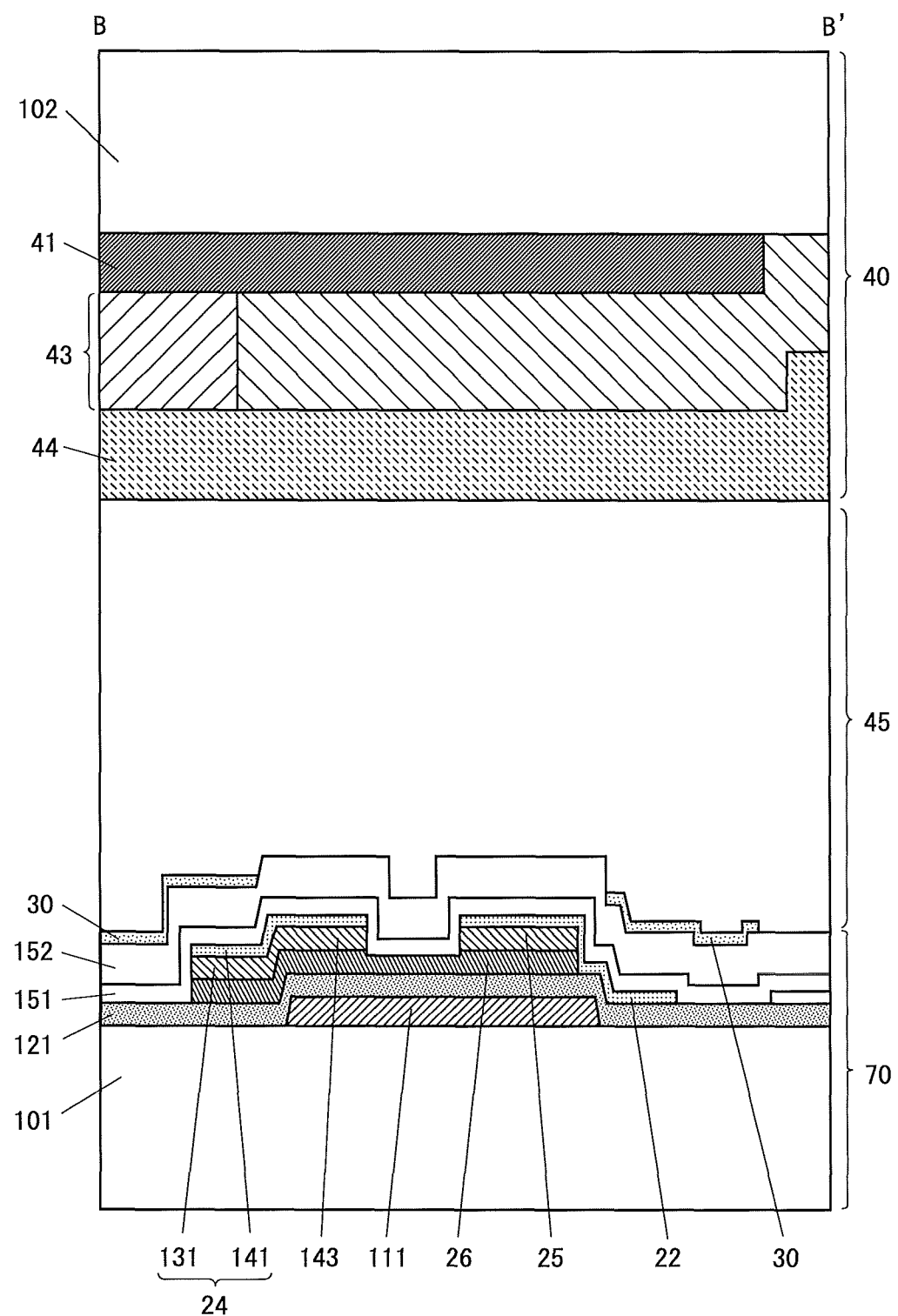
FIG. 19 is a sectional view of the liquid crystal panel including the active matrix substrate according to the second embodiment.
Figure 20:
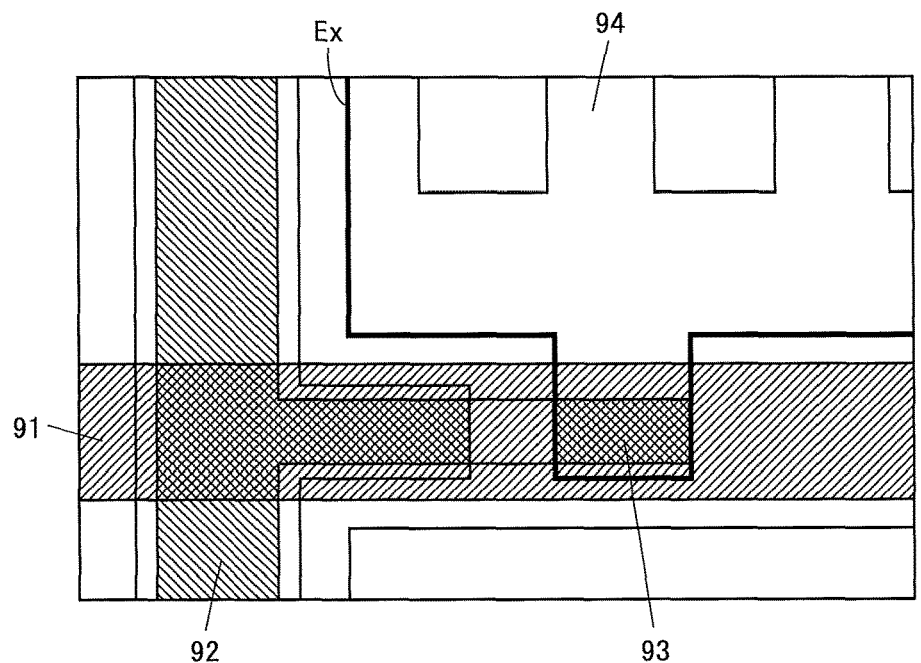
FIG. 20 is a layout diagram of a conventional active matrix substrate.
Figure 21:
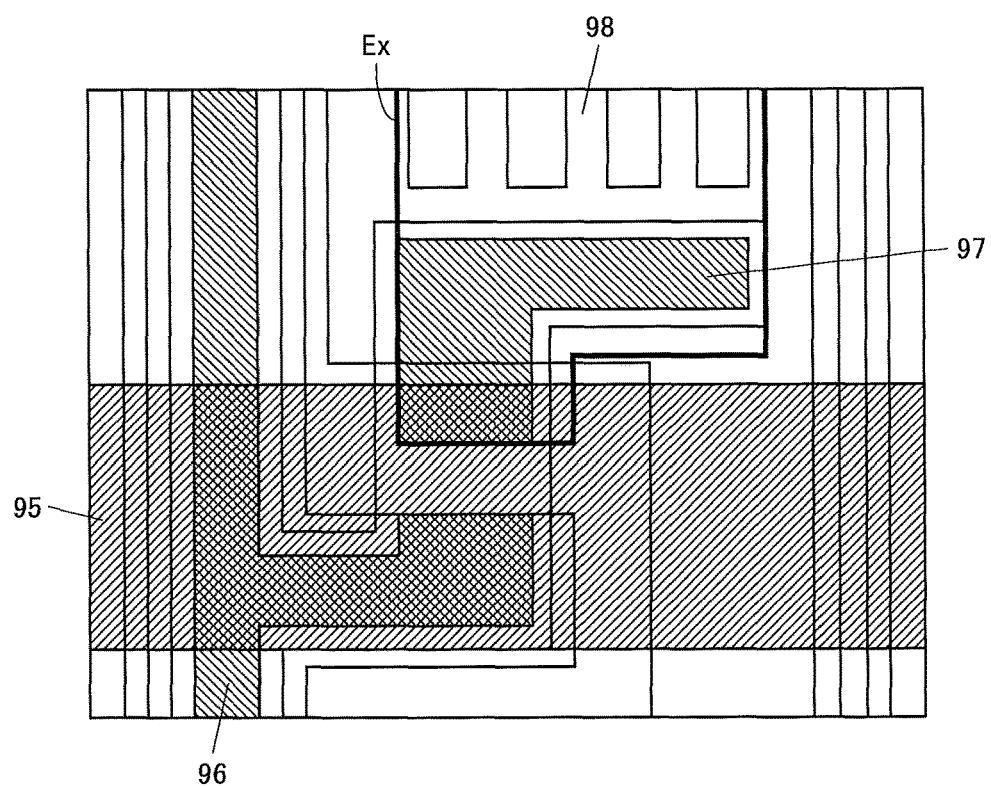
FIG. 21 is a layout diagram of a conventional active matrix substrate.

FIG. 19 is a sectional view of a liquid crystal panel according to the present embodiment. FIG. 19 shows a cross section taken along a line B-B' in FIG. 17. An active matrix substrate 70 according to the present embodiment is different from the active matrix substrate 10 according to the first embodiment in that the semiconductor layer 26 consisting of the amorphous Si film 122 and the n+amorphous Si film 123 exist in a layer under the main conductor part 131 of the data line 24. Thus, in the active matrix substrate 70, the data line 24 becomes thick by an amount corresponding to the semiconductor layer 26.

In the manufacturing method according to the present embodiment, photolithography is performed using different photomasks in the first and third to sixth processes, and photolithography is not performed in the second process. The number of photomasks used in the manufacturing method according to the present embodiment is five in total. Thus, according to the manufacturing method according to the present embodiment, the number of photomasks to be used can be reduced by one from the manufacturing method according to the first embodiment, and manufacturing cost can be reduced.

As described above, in the method for manufacturing the active matrix substrate 70, a semiconductor film (amorphous Si film 122 and n+amorphous Si film 123) is formed in a semiconductor layer forming step (second process), and the main conductor part 131 of the data line 24 and the conductor part 132 to be the drain electrode 25 and the source electrode of the thin film transistor are formed, and concurrently the semiconductor film is patterned in a source layer forming step (third process). In this manner, by patterning the semiconductor layer in the source layer forming process, the active matrix substrate 70 can be manufactured using a small number of photomasks.

Furthermore, in the active matrix substrate 70 according to the present embodiment, the semiconductor layer 61 is formed in a layer under the data line 24, the source electrode of the thin film transistor, and the drain electrode 25. The active matrix substrate 70 like this can be easily manufactured using the above-described manufacturing method.

Note that there is described a case in which the active matrix substrate 70 having an approximately same layout configuration as that of the active matrix substrate (FIG. 13) according to the second variant of the first embodiment manufactured using five photomasks. Similarly, an active matrix substrate having an approximately same layout configuration as that of the active matrix substrate according to the first embodiment or other variants of the first embodiment may be manufactured using five photomasks.

Furthermore, although the active matrix substrate having a specific layout configuration is described in the above description, the present invention can be applied to active matrix substrates having other layout configurations. For example, shapes of the gate electrode, the drain electrode, the source electrode, and the semiconductor layer of the TFT included in the active matrix substrate, shapes of the gate line and the data line, and an extending direction of the slit of the common electrode are not limited to those described above.

As described above, according to the active matrix substrate of the present invention, by forming the extension part of the pixel electrode also on the second side of the gate line (a side opposite to a side where the main body part of the pixel electrode is disposed) without forming the drain electrode on the second side of the gate line, it is possible to prevent degradation of display quality due to the variation in the parasitic capacitance between the gate and the drain of the TFT in the pixel circuit.

INDUSTRIAL APPLICABILITY

Since the active matrix substrate of the present invention has a feature that is can prevent degradation of display quality due to a variation in a parasitic capacitance between a gate and a drain of a TFT in a pixel circuit, it can be used for configuring a liquid crystal panel or the like, and can be used for a display unit of various kinds of electronic equipment, or the like.

DESCRIPTION OF REFERENCE CHARACTERS

1: LIQUID CRYSTAL DISPLAY DEVICE
2: LIQUID CRYSTAL PANEL
3: DISPLAY CONTROL CIRCUIT
4: GATE LINE DRIVE CIRCUIT
5: DATA LINE DRIVE CIRCUIT
6: BACKLIGHT
10, 70: ACTIVE MATRIX SUBSTRATE
11: COUNTER REGION
12: NON-COUNTER REGION
20: PIXEL CIRCUIT
21: TFT
22, 54: PIXEL ELECTRODE
23, 53: GATE LINE
24, 57: DATA LINE
25, 51: DRAIN ELECTRODE
26, 52, 61: SEMICONDUCTOR LAYER
30: COMMON ELECTRODE
31, 55: SLIT
40: COUNTER SUBSTRATE

The invention claimed is:
1. An active matrix substrate comprising:
a plurality of gate lines extending in a first direction;
a plurality of data lines extending in a second direction;
a plurality of pixel circuits arranged corresponding to intersections of the gate lines and the data lines and each including a thin film transistor and a pixel electrode;
a protective insulating film formed in a layer over the gate line, the data line, the thin film transistor, and the pixel electrode; and
a common electrode formed in a layer over the protective insulating film, wherein
the thin film transistor has a gate electrode formed integrally with the gate line, a source electrode formed integrally with the data line, and a drain electrode directly connected to the pixel electrode and having an overlapping portion with the gate electrode,
the pixel electrode has a main body part formed on a first side of the gate line, and an extension part extending in the second direction and covering the overlapping portion of the gate electrode and the drain electrode, the drain electrode is not formed on a second side of the gate line, and the extension part of the pixel electrode is formed also on the second side of the gate line.

2. The active matrix substrate according to claim 1, wherein the drain electrode is formed in a region where the gate line and the gate electrode are formed.

3. The active matrix substrate according to claim 1, wherein a semiconductor layer of the thin film transistor is formed in a region where the gate line and the gate electrode are formed.

4. The active matrix substrate according to claim 1, wherein
the gate line is configured to pass through the pixel circuit,
the pixel electrode further has a second main body part formed on the second side of the gate line, and
the extension part of the pixel electrode is configured to connect the main body part and the second main body part of the pixel electrode.

5. The active matrix substrate according to claim 4, wherein
the common electrode has one or more slits in a region corresponding to the main body part and the second main body part, and
at least one slit is not formed above the gate line.

6. The active matrix substrate according to claim 1, wherein the thin film transistors are formed on both sides of the data line alternately.

7. The active matrix substrate according to claim 1, wherein the common electrode has one or more slits corresponding to the pixel circuit.

8. The active matrix substrate according to claim 1, wherein a semiconductor layer is formed in a layer under the data line, the source electrode, and the drain electrode.

9. A liquid crystal panel comprising:
the active matrix substrate according to claim 1; and
a counter substrate facing the active matrix substrate.

10. The active matrix substrate according to claim 1, wherein
the extension part of the pixel electrode directly and entirely overlaps the drain electrode at the overlapping portion.

11. The active matrix substrate according to claim 1, wherein
the second side of the gate line is an opposite side of the main body part of the pixel electrode across an edge of the gate line, the edge extending in the first direction and being farthest from the main body part of the pixel electrode.

12. An active matrix substrate comprising:
a plurality of gate lines extending in a first direction;
a plurality of data lines extending in a second direction;
a plurality of pixel circuits arranged corresponding to intersections of the gate lines and the data lines and each including a thin film transistor and a pixel electrode;
a protective insulating film formed in a layer over the gate line, the data line, the thin film transistor, and the pixel electrode; and
a common electrode formed in a layer over the protective insulating film, wherein the thin film transistor has a gate electrode formed integrally with the gate line, a source electrode formed integrally with the data line, and a drain electrode having an overlapping portion with the gate electrode,
the pixel electrode has a main body part formed on a first side of the gate line, and an extension part extending in the second direction,
the extension part of the pixel electrode is formed also on the second side of the gate line and directly overlaps the drain electrode at the overlapping portion.

13. A method for manufacturing an active matrix substrate including a plurality of pixel circuits each having a thin film transistor and a pixel electrode, the method comprising the steps of:
forming a plurality of gate lines extending in a first direction, and concurrently forming a gate electrode of the thin film transistor integrally with the gate line;
forming a semiconductor layer of the thin film transistor;
forming a source layer by forming a main conductor part of a plurality of data lines extending in a second direction, and concurrently forming a conductor part to be a base of a drain electrode and a source electrode of the thin film transistor, integrally with the main conductor part;
forming a pixel electrode layer by forming the pixel electrode and an accessory conductor part of the data line, and concurrently patterning the conductor part to form the drain electrode and the source electrode of the thin film transistor;
forming a protective insulating film in a layer over the pixel electrode; and
forming a common electrode in a layer over the protective insulating film, wherein
in forming the source layer and in forming the pixel electrode layer, the drain electrode is formed so as to have an overlapping portion with the gate electrode,
in forming the pixel electrode layer, an electrode having a main body part formed on a first side of the gate line and an extension part extending in the second direction, and covering the overlapping portion of the gate electrode and the drain electrode,
in forming the source layer and in forming the pixel electrode layer, the drain electrode is not formed on a second side of the gate line, and
in forming the pixel electrode layer, the extension part of the pixel electrode is formed also on the second side of the gate line and directly overlaps the drain electrode at the overlapping portion.

14. The method for manufacturing the active matrix substrate according to claim 13, wherein
the extension part of the pixel electrode directly and entirely overlaps the drain electrode at the overlapping portion.

15. The method for manufacturing the active matrix substrate according to claim 13, wherein in forming the semiconductor layer, a semiconductor film is formed and the semiconductor film is patterned.

16. The method for manufacturing the active matrix substrate according to claim 13, wherein
in forming the semiconductor layer, a semiconductor film is formed, and
in forming the source layer, the main conductor part and the conductor part are formed and concurrently the semiconductor film is patterned.

* * * * *